US012655348B2

(12) United States Patent
Kim

(10) Patent No.: US 12,655,348 B2
(45) Date of Patent: Jun. 16, 2026

(54) INK COMPOSITION AND ELECTRONIC DEVICE INCLUDING FILM FORMED USING THE INK COMPOSITION

(71) Applicant: Samsung Display Co., Ltd., Yongin-si (KR)

(72) Inventor: Joonhyung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 905 days.

(21) Appl. No.: 17/715,776

(22) Filed: Apr. 7, 2022

(65) Prior Publication Data

US 2023/0098571 A1 Mar. 30, 2023

(30) Foreign Application Priority Data

Sep. 16, 2021 (KR) ........................ 10-2021-0124259

(51) Int. Cl.

| | |
|---|---|
| ***C09K 11/70*** | (2006.01) |
| ***B82Y 20/00*** | (2011.01) |
| ***B82Y 40/00*** | (2011.01) |
| ***C09D 11/03*** | (2014.01) |
| ***C09D 11/101*** | (2014.01) |
| ***C09K 11/02*** | (2006.01) |
| ***C09K 11/56*** | (2006.01) |
| ***C09K 11/88*** | (2006.01) |
| ***H10K 50/115*** | (2023.01) |
| ***H10K 71/00*** | (2023.01) |

(52) U.S. Cl.

CPC .............. *C09K 11/70* (2013.01); *C09D 11/03* (2013.01); *C09D 11/101* (2013.01); *C09K 11/02* (2013.01); *C09K 11/565* (2013.01); *C09K 11/883* (2013.01); *B82Y 20/00* (2013.01); *B82Y 40/00* (2013.01); *H10K 50/115* (2023.02); *H10K 71/00* (2023.02)

(58) Field of Classification Search

CPC ....... C09D 11/101; C09D 11/03; C09K 11/02; C09K 11/565; C09K 11/70; C09K 11/883

See application file for complete search history.

(56) References Cited

U.S. PATENT DOCUMENTS

| | | | |
|---|---|---|---|
| 7,982,812 | B2 | 7/2011 | Rho et al. |
| 2013/0177719 | A1 | 7/2013 | Tasaka et al. |
| 2019/0129302 | A1 | 5/2019 | Youn et al. |
| 2020/0231871 | A1 | 7/2020 | Kim et al. |
| 2021/0024819 | A1 | 1/2021 | Kang et al. |
| 2021/0108135 | A1 | 4/2021 | Yonghee et al. |

FOREIGN PATENT DOCUMENTS

| | | | |
|---|---|---|---|
| CN | 103025839 | A | 4/2013 |
| JP | 2019-086745 | * | 6/2019 |
| JP | 2021054918 | A | 4/2021 |
| KR | 1020070094679 | A | 9/2007 |
| KR | 1020090036373 | A | 4/2009 |
| KR | 1020190102857 | A | 9/2019 |
| KR | 1020190108710 | A | 9/2019 |
| KR | 1020200015270 | A | 2/2020 |
| KR | 1020200073982 | A | 6/2020 |
| KR | 1020200073992 | A | 6/2020 |
| KR | 1020200114465 | A | 10/2020 |
| KR | 1020210012828 | A | 2/2021 |
| KR | 1020210030787 | A | 3/2021 |
| KR | 1020210044043 | A | 4/2021 |
| KR | 1020210044045 | A | 4/2021 |
| KR | 1020210048934 | A | 5/2021 |
| KR | 1020200090493 | A | 7/2021 |

OTHER PUBLICATIONS

Maxime Lecompère, et al., Versatility of Pyrylium Salt/Vinyl Ether Initiating System for Epoxide Dual-Cure Polymerization: Kick-Starting Effect of the Coinitiator, Macromol. Rapid Commun. 2017, 6 pp.

* cited by examiner

*Primary Examiner* — C Melissa Koslow
(74) *Attorney, Agent, or Firm* — CANTOR COLBURN LLP

(57) ABSTRACT

An ink composition including: a quantum dot including one or more ligands on a surface of the quantum dot; a first monomer including one or more epoxy groups; a second monomer including one or more oxetane groups; and a vinyl group-containing compound including one or more vinyl groups, wherein the one or more ligands include one or more polar moieties. Also provided is an electronic apparatus including a film formed using the ink composition, and a light emitting device.

16 Claims, 4 Drawing Sheets

INK COMPOSITION AND ELECTRONIC DEVICE INCLUDING FILM FORMED USING THE INK COMPOSITION

CROSS-REFERENCE TO RELATED APPLICATION

This application claims priority under 35 U.S.C. § 119 to Korean Patent Application No. 10-2021-0124259, filed on Sep. 16, 2021, in the Korean Intellectual Property Office, and all the benefits accruing therefrom, the disclosure of which in its entirety is incorporated by reference herein.

BACKGROUND

1. Field

An ink composition and an electronic apparatus including a film formed using the ink composition.

2. Description of the Related Art

Light-emitting devices are devices that convert electrical energy into light energy. Examples of such light-emitting devices include an organic light-emitting device using an organic material for an emission layer, a quantum dot light-emitting device using quantum dots for an emission layer, and the like. Such a light-emitting device may be included in various electronic apparatuses such as a display apparatus.

As a method of implementing color in a display apparatus, a method that can provide an increase color purity of red (R), green (G), and blue (B) light by using a color conversion layer has been proposed where the color conversion layer includes a color-converting luminescent material that absorbs light of a specific wavelength and converts that wavelength of light to a different wavelength.

Such a color conversion layer may be formed by an inkjet printing method. Accordingly, there is a need for an ink material suitable for use in an inkjet printing method.

SUMMARY

One or more embodiments include an ink composition and an electronic apparatus including a film formed using the ink composition, wherein the ink composition has improved adhesion force, reduced cure shrinkage, and/or a reducible film manufacturing cost. However, these technical objectives are listed as examples only, and do not limit the scope of the present disclosure or claims.

Additional aspects will be set forth in part in the description, which follows and, in part, will be apparent from the description, or may be learned by practice of the presented embodiments of the disclosure.

According to one or more embodiments, an ink composition includes a quantum dot including one or more ligands on a surface of the quantum dot, a first monomer including one or more epoxy groups, a second monomer including one or more oxetane groups, and a vinyl group-containing compound including one or more vinyl groups, wherein the one or more ligands include one or more polar moieties.

According to one or more embodiments, an electronic apparatus includes a film formed using the above ink composition and a light-emitting device that includes a first electrode, a second electrode, and an interlayer between the first electrode and the second electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
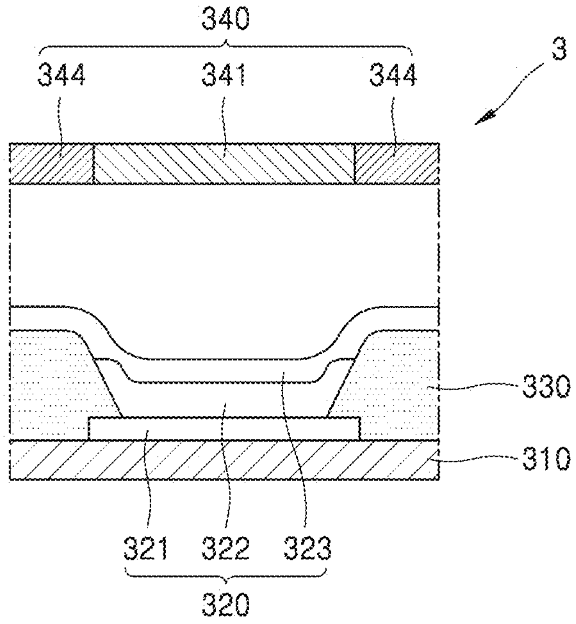
FIG. 1 is a schematic view of a light-emitting apparatus according to an embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, embodiments are merely described below, and in-part by referring to the figures, to explain aspects of the present description.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the same associated listed items. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The disclosure may have diverse modified embodiments, including the embodiments as illustrated or represented in the drawings and described in the detailed description. Exemplary embodiments are described herein with reference to cross section illustrations that are schematic illustrations of idealized embodiments. As such, variations from the shapes of the illustrations as a result, for example, of manufacturing techniques and/or tolerances, are to be expected. For example, the relative size of components in the drawings may be exaggerated for convenience of explanation. In other words, because sizes and thicknesses of components in the drawings are arbitrarily illustrated for convenience of explanation, the following embodiments are not limited thereto. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. An effect and a characteristic of the disclosure, and a method of accomplishing these will be apparent when referring to embodiments described with reference to the drawings. The present disclosure may, however, be embodied in many different forms and should not be construed as limited to the embodiments set forth herein.

In Examples below, the prefix ‘poly’ refers to the plural number of 1 or more.

It will be understood that when a layer, region, or component is referred to as being “on” or “onto” another layer, region, or component, it may be directly or indirectly formed on the other layer, region, or component. That is, for example, intervening elements, layers, regions, or components may be present. In contrast, when an element is referred to as being “directly on” another element, there are no intervening elements, layers, regions, or components present.

In the present specification, the term “polar moieties” refers to an organic or inorganic functional group known in organic chemistry that contains one or more heteroatoms or halogens with different electronegativity, e.g., a different electronegativity than that of carbon, arranged in a non-symmetric manner or as a repeat unit in a chain functional group. For example, an unsubstituted, linear or branched alkyl group is considered as a non-polar moiety whereas an alkyl group substituted with a halogen, a nitrogen or oxygen (or sulfur) containing group would be considered a polar moiety. Likewise, an unsubstituted linear or branched alkylene chain is considered as a non-polar moiety whereas an oxyalkylene (having ether functionality) is considered as a polar moiety.

In the present specification, the term “room temperature” refers to about 25° C.

The term “alkane” refers to and includes saturated straight and branched chain alkane groups, optionally, with one or more heteroatoms in a main-chain of the alkane. Preferred alkane groups are those containing 1 to 20 carbon atoms and may be substituted or unsubstituted.

The term “cyclic alkane” refers to and includes saturated monocyclic, polycyclic, and spiro alkane groups, optionally, with one or more heteroatoms in the cyclic-chain of the cyclic alkane. Preferred cyclic alkane groups are those containing 3 to 20 carbon atoms and may be substituted or unsubstituted.

The term “alkyl” refers to and includes both straight and branched chain alkyl radicals. Preferred cyclic alkane groups are those containing 3 to 20 carbon atoms and may be substituted or unsubstituted. Preferred alkyl groups are those containing from one to twenty carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like.

The term “cyclic alkyl” refers to and includes monocyclic, polycyclic, and spiro alkyl radicals. Preferred cyclic alkyl groups are those containing 3 to 20 ring carbon atoms, optionally, with one or more heteroatoms in the cyclic-chain of the cyclic alkyl, and may be substituted or unsubstituted. Preferred cyclic alkyl groups include cyclopropyl, cyclopentyl, cyclohexyl, bicyclo[3.1.1]heptyl, spiro[4.5]decyl, spiro[5.5]undecyl, adamantyl, and the like.

The term “alkene” refers to and includes an unsaturated straight and branched chain alkene group that include at least one carbon-carbon double bond in the alkyl chain. Preferred alkene groups are those containing 2 to 20 carbon atoms, optionally, with one or more heteroatoms in the alkene group, and may be substituted or unsubstituted.

The term “cyclic alkene” group is essentially a cyclic alkane group that include at least one carbon-carbon double bond in the cycloalkyl ring.

The term “arene” refers to and includes both single-ring aromatic hydrocarbyl groups and polycyclic aromatic ring systems. The polycyclic rings may have two or more rings in which two carbons are common to two adjoining rings (the rings are “fused”) wherein at least one of the rings is an aromatic hydrocarbyl group, e.g., the other rings can be cyclic alkyls or cyclic alkenyl. Preferred arene groups are those containing 6 to 20 carbon atoms. Preferred arene groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the arene group may be optionally substituted.

The term “heteroarene” refers to and includes both single-ring heteroaromatic groups and polycyclic aromatic ring systems that include at least one heteroatom. The heteroatoms include, but are not limited to O, S, N, P, B, Si and Se. In many instances, O, S or N are the preferred heteroatoms. Hetero-single ring aromatic systems are preferably single rings with 5 or 6 ring atoms, and the ring can have from one to four heteroatoms. The hetero-polycyclic ring systems can have two or more rings in which two atoms are common to two adjoining rings (the rings are “fused”) wherein at least one of the rings is a heteroaryl, e.g., the other rings can be cyclic alkyls, cyclic alkenyls, or arene. The hetero-polycyclic aromatic ring systems can have from one to six heteroatoms per ring of the polycyclic aromatic ring system. Preferred heteroarene groups are those containing 3 to 20 carbon atoms. Exemplary heteroarene groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroarene group may be optionally substituted.

As indicated, the terms alkane, alkyl, cyclic alkyl, alkene, cyclic alkene, arene, and heteroarene, as used herein, are independently unsubstituted or substituted with one or more general substituents. In many instances, the general substituents are selected from the group consisting of deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

Ink Composition

An aspect of the present disclosure provides an ink composition including: a quantum dot including one or more ligands on a surface of the quantum dot; a first monomer including one or more epoxy groups; a second monomer including one or more oxetane groups; and a vinyl group-containing compound including one or more vinyl groups, wherein the one or more ligands include one or more polar moieties.

In an embodiment, the first monomer may include 1, 2, 3, 4, or 5 epoxy groups. In one or more embodiments, the first monomer may include 2, 3, 4, or 5 epoxy groups.

In an embodiment, the first monomer may have, in a molecular structure thereof, a cyclic structure and/or a linear or branched structure. In one or more embodiments, the first monomer may have, in a molecular structure thereof, a cyclic structure and a linear or branched structure.

In one or more embodiments, the first monomer may include a linear or branched $C_1$-$C_{20}$ alkane group, a cyclic $C_3$-$C_{20}$ alkane group, a linear or branched $C_2$-$C_{20}$ alkene group, a $C_3$-$C_{20}$ cyclic alkene group, or a $C_6$-$C_{20}$ arene group.

In one or more embodiments, the first monomer may include an ether group or an ester group.

In an embodiment, the first monomer may be represented by Formula 1-1 or 1-2:

Formula 1-1

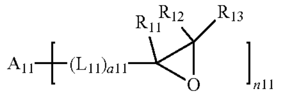

Formula 1-2

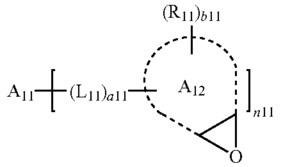

wherein, in Formulae 1-1 and 1-2, $A_{11}$ may be a linear or branched $C_1$-$C_{20}$ alkane group, a cyclic $C_3$-$C_{20}$ alkane group, a linear or branched $C_2$-$C_{20}$ alkene group, a $C_3$-$C_{20}$ cyclic alkene group, or a $C_6$-$C_{20}$ arene group, $A_{12}$ may be a cyclic $C_3$-$C_{20}$ alkane group or a cyclic $C_3$-$C_{20}$ alkene group, $L_{11}$ may be

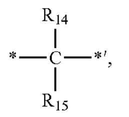

*—O—*', or

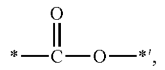

a11 may be 0, 1, 2, 3, 4, 5, 6, 7, 8, 9, or 10, $R_{11}$ to $R_{15}$ may each independently be hydrogen, deuterium, a halogen, or a linear or branched $C_1$-$C_{20}$ alkyl, or a $C_3$-$C_{20}$ cyclic alkyl group, b11 may be an integer from 1 to 12, n11 may be 1, 2, 3, 4, or 5, and

* and *' each indicate a binding site to a neighboring atom.

In one or more embodiments, when the first monomer includes a linear or branched alkane group, specific examples of the first monomer are the following compounds, but embodiments of the present disclosure are not limited thereto:

1) mono-functional compound: butyl glycidyl ether, isobutyl glycidyl ether, 2-ethylhexyl glycidyl ether, hexadecyl glycidyl ether, triethyleneglycol diglycidyl ether, allyl glycidyl ether, polypropylene glycol glycidyl ether, glycidyl ester neodecanonate, or the like;
2) di-functional compound: 1,4-butanediol diglycidyl ether, ethylene glycol diglycidyl ether, 1,6-hexanediol diglycidyl ether, propylene glycol diglycidyl ether, diethylene glycol diglycidyl ether, neopentyl glycol diglycidyl ether, 1,4-cyclohexanedimethanol diglycidyl ether, polypropylene glycol diglycidyl ether, or the like; and
3) tri-functional or poly-functional compound: glycerol triglycidyl ether, trimethyrolpropane triglycidyl ether, pentaerythritol polyglycidyl ether, dipentaerythritol polyglycidyl ether, alkyl polyol-type polyglycidyl ether, or the like.

In one or more embodiments, when the first monomer includes a cyclic group, specific examples of the first monomer are the following compounds, but embodiments of the present disclosure are not limited thereto:

cyclohexyldimethanol glycidyl ether, dicyclopentadiene glycidyl ether, 1,2-epoxy-4-vinylcyclohexane, 3',4'-epoxycyclohexylmethyl 3,4-epoxycyclohexyl carboxylate, 3',4'-epoxycyclohexylmethyl-3,4-epoxycyclohexyl carboxylate denatured caprolactone, naphthyl glycidyl ether, cresyl glycidyl ether, para t-butylphenol glycidyl ether, thiodiphenyl diglycidyl ether, 3-alkylphenol glycidyl ether, o-phenylphenol glycidyl ether, benzyl glycidyl ether, o-butylphenyl glycidyl ether, resorcinol diglycidyl ether, bisphenol A diglycidyl ether, bisphenol F diglycidyl ether, bisphenol S diglycidyl ether, 2,2"-diarylbisphenol A diglycidyl ether, propylene oxide added bisphenol A diglycidyl ether, 2-biphenyl glycidyl ether, triglycidyl aminophenol, tetraglycidyl methylenedianiline, or the like.

In one or more embodiments, the commercially available compound of the first monomer may include: for example, the KF EPIOL® product line manufactured by Kukdo Finechem Co., Ltd., such as ME-100, ME101, ME103, ME105, ME106, ME102, ME700, ME701, ME702, ME704, DE200, DE 201, DE202, DE203, DE204, DE205, DE207, DE208, DE209, DE213, DE214, DE215, DE216, DE703, DE704, PE300, PE311, PE411, PE412, or PE510; the EPODIL® product line manufactured by EVONIK Company, such as 733, 741, 742, 746, 747, 748, 749, 750, 757, 759, 761, 777, or 781; the CELLOXIDE® product line manufactured by DICELL Company, such as 2021P, 2000, 2081, or 8010; the HELOXY® product line manufactured by HEXION, such as DB, HD, or WF and the EPICOTE® Resin product line of the same company, such as 215, 232, 235, 238, 240, 246, 320, 827, 828EL, 862, or 896; the GLYCIROL® ED product line manufactured by Adeka Company, such as ED-502, ED-509, ED-529, ED-503, ED-506, ED-523T, ED-505, or ED-508, and ED-512EX and the EP product line of the same company, such as EP-4400, EP-4520, EP4530, or EP-4005; the EPICLON® product line manufactured by DIC Company, such as 520, HP-4032SS, TGAP BPFDGE, BPADGE, HP-4770, EXA-4750, or EXA-7250; and the like.

The first monomer may be used alone, or two or more different types of the first monomer may be used in combination.

A molecular weight of the first monomer may be in a range of about 100 grams per mole (g/mol) to about 800 g/mol.

An amount of the first monomer in the ink composition may be, based on 100 parts by weight of the ink composition, about 10 parts by weight or more and less than 70 parts by weight, more preferably, about 15 parts by weight or more and less than 50 parts by weight. When the amount of the first monomer is within these ranges, the ink composition may maintain a relative constant viscosity and have improved curing characteristics and improved crosslinking during curing.

In an embodiment, the second monomer may include 1, 2, 3, 4, or 5 oxetane groups.

In an embodiment, the second monomer may have, in a molecular structure thereof, a cyclic structure and/or a linear or branched structure. In one or more embodiments, the second monomer may have, in a molecular structure thereof, a cyclic structure and a linear or branched structure.

In one or more embodiments, the second monomer may include a linear or branched $C_1$-$C_{20}$ alkane group, a $C_3$-$C_{20}$ cyclic alkane group, a linear or branched $C_2$-$C_{20}$ alkene group, a $C_3$-$C_{20}$ cyclic alkene group, or a $C_6$-$C_{20}$ arene group.

In one or more embodiments, the second monomer may include an ether group or an ester group.

In an embodiment, the second monomer may be represented by Formula 2-1 or 2-2:

Formula 2-1

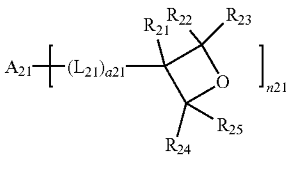

-continued

Formula 2-2

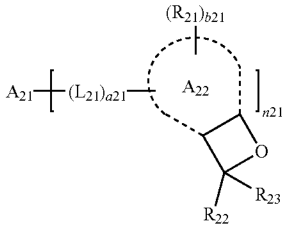

wherein, in Formulae 2-1 and 2-2, $A_{21}$ may be a linear or branched $C_1$-$C_{20}$ alkane group, a cyclic $C_3$-$C_{20}$ alkane group, a linear or branched $C_2$-$C_{20}$ alkene group, or cyclic a $C_3$-$C_{20}$ alkene group, or a $C_6$-$C_{20}$ arene group, $A_{22}$ may be a cyclic $C_3$-$C_{20}$ alkane group or a cyclic $C_3$-$C_{20}$ alkene group, $L_{21}$ may be

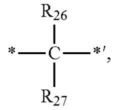

*—O—*', or

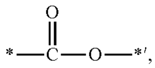

a21 may be 0, 1, 2, 3, 4, 5, 6, 7, 8, 9, or 10, $R_{21}$ to $R_{27}$ may each independently be hydrogen, deuterium, a halogen, a linear or branched $C_1$-$C_{20}$ alkane group, or a cyclic $C_1$-$C_{20}$ alkyl group, b21 may be an integer from 1 to 12, n21 may be 1, 2, 3, 4, or 5, and

* and $*^1$ each indicate a binding site to a neighboring atom.

In one or more embodiments, examples of the second monomer are 1,4-bis[(3-ethyl-3-oxetanyl methoxy)methyl] benzene, 1,4-bis[(3-methyl-3-oxetanyl methoxy)methyl] benzene, 3-methyl-3-glycidyl oxetane, 3-ethyl-3-glycidyl oxetane, di[1-ethyl(3-oxetanyl)]methylether, 3-ethyl-3-hydroxymethyl oxetane, 3-ethyl-3-[(3-ethoxyoxetane-3-yl) methoxy] oxetane, 3-ethyl-3-phenoxymethyl oxetane, 3-ethyl-3-[(2-ethylhexyloxy)methyl] oxetane, oxetanyl-silicate, phenolnovolac oxetane, and the like, but embodiments of the present disclosure are not limited thereto.

In one or more embodiments, the commercially available compound of the second monomer may include: for example, the ARON® OXETANE product line manufactured by TOAGOSEI Company, such as OXT-221, OXT-101, OXT-121, OXT-212, OXT-211, CHOX, or OX-SC; the ETERNACOLL® product line manufactured by Ube Company, such as EHO, OXBP, OXTP, or OXMA; and the like, but embodiments of the present disclosure are not limited thereto.

The second monomer may be used alone, or two or more different types of the second monomer may be used in combination.

A molecular weight of the second monomer may be in a range of about 100 g/mol to about 800 g/mol.

An amount of the second monomer may be, based on 100 parts by weight of the ink composition, about 5 parts by weight or more and less than 80 parts by weight, more preferably, about 15 parts by weight or more and less than 50 parts by weight. When the amount of the second monomer is within these ranges, the viscosity of the ink composition may remain relatively constant, the ink composition may exhibit improved curing characteristics, and/or improved crosslinking degree during curing.

An amount of the second monomer may be in a range of about 20 parts by weight to about 350 parts by weight based on 100 parts by weight of the first monomer. When the ratio of the first monomer to the second monomer is within these ranges, the ink composition may exhibit improved adhesion force and/or improved peel-off force.

In an embodiment, the ink composition may further include a third monomer including one or more epoxy groups, wherein the first monomer and the third monomer may be different from each other. In the present specification, the third monomer may be understood with reference to the description of the first monomer, unless specifically defined otherwise.

In an embodiment, the first monomer may include a linear or branched $C_1$-$C_{20}$ alkane group or a linear or branched $C_2$-$C_{20}$ alkene group, and the third monomer may include a cyclic $C_3$-$C_{20}$ alkane group, a cyclic $C_3$-$C_{20}$ alkene group, or a $C_6$-$C_{20}$ arene group.

In one or more embodiments, the first monomer may be represented by Formula 1-1, and the third monomer may be represented by Formula 1-2:

Formula 1-1

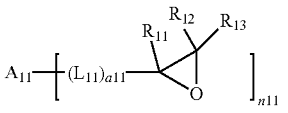

Formula 1-2

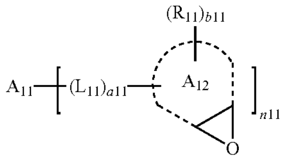

wherein, in Formulae 1-1 and 1-2, $A_{11}$ may be a linear or branched $C_1$-$C_{20}$ alkane group or a linear or branched $C_2$-$C_{20}$ alkene group, $A_{12}$ may be a cyclic $C_3$-$C_{20}$ alkane group or a cyclic $C_3$-$C_{20}$ alkene group, $L_{11}$ may be

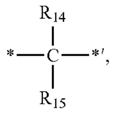,

*—O—*', or

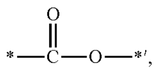, a11 may be 0, 1, 2, 3, 4, 5, 6, 7, 8, 9, or 10, $R_{11}$ to $R_{15}$ may each independently be hydrogen, deuterium, a halogen, a linear or branched $C_1$-$C_{20}$ alkyl group, or cyclic $C_3$-$C_{20}$ alkyl group, b11 may be an integer from 1 to 12, n11 may be 1, 2, 3, 4, or 5, and

* and *' each indicate a binding site to a neighboring atom.

The third monomer may be used alone, or two or more different types of the third monomer may be used in combination.

A molecular weight of the third monomer may be in a range of about 100 g/mol to about 800 g/mol.

An amount of the third monomer may be, based on 100 parts by weight of the ink composition, about 5 parts by weight or more and less than 50 parts by weight, more preferably, about 10 parts by weight or more and less than 30 parts by weight. When the amount of the third monomer is within these ranges, the viscosity of the ink composition may remain relatively constant, the ink composition may exhibit improved curing characteristics, and/or improved crosslinking degree during curing.

An amount of the third monomer may be in a range of about 20 parts by weight to about 500 parts by weight based on 100 parts by weight of the first monomer. When the ratio of the first monomer to the third monomer is within these ranges, the ink composition may exhibit improved adhesion force and/or further improved peel-off force.

In an embodiment, each of the first monomer to the third monomer included in the ink composition may be a monomer that can form a film by a ring-opening polymerization mechanism. That is, when the ink composition forms a film by a ring-opening polymerization mechanism compared to a conventional carbon-carbon double bond polymerization mechanism, film shrinkage, generation of stress due to the film shrinkage, and/or bending or deterioration of a device due to the stress may be relatively reduced. In addition, the ink composition may have relatively high adhesion force to a substrate such as a glass substrate.

In one or more embodiments, each of the first monomer to the third monomer included in the ink composition may be a monomer that can form a film by a cation-polymerization mechanism. That is, when the ink composition forms a film by a cation-polymerization mechanism compared to a conventional acryl radical polymerization mechanism, little or no polymerization inhibition phenomenon by ambient oxygen occurs. Accordingly, costs for maintaining a working environment may be reduced, and the need of an operator for safety management may be also lowered.

In an embodiment, the vinyl group-containing compound may be represented by Formula 3-1 or 3-2:

Formula 3-1

Vinyl-O-$(L_{31})_{a31}$-$R_{31}$

Formula 3-2

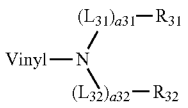

wherein, in Formulae 3-1 and 3-2,

Vinyl represents $H_2C{=}CH$—, $L_{31}$ and $L_{32}$ may each independently be

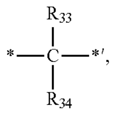

*—O—*', or

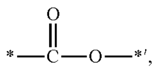

a31 and a32 may each independently be 0, 1, 2, 3, 4, or 5, $R_{31}$ to $R_{34}$ may each independently be hydrogen, deuterium, a halogen, a linear or branched $C_1$-$C_{20}$ alkyl group, or a cyclic $C_3$-$C_{20}$ alkyl group, wherein $R_{31}$ and $R_{32}$ are optionally linked to form a substituted or unsubstituted carbocyclic group or a substituted or unsubstituted heterocyclic group, and

* and *' each indicate a binding site to a neighboring atom.

In one or more embodiments, the vinyl group-containing compound may be, for example, butanedioldivinylether, diethylenglycol divinylether, triethylenglycol divinylether, 1,4-cyclohexanedimethanol divinylether, ethyl vinylether, propyl vinylether, butyl vinylether, N-vinyl-2-pyrrolidone, N-vinyl caprolactam, N-vinylimidazole, vinyl methyloxazoledinone, cyclohexyl vinylether, dodecyl vinylether, octadecyl vinylether, hydroxybutyl vinylether, ethyl vinylether, or the like, but embodiments of the present disclosure are not limited thereto.

In one or more embodiments, the commercially available compound of the vinyl group-containing compound may include: for example, CHDM-di, DVE-2, DVE-3, VMOX, or Vinylcaprolactam HO-Tempo manufactured by BASF Company, but embodiments of the present disclosure are not limited thereto.

An amount of the vinyl group-containing compound may be in a range of about 10 parts by weight to about 150 parts by weight based on 100 parts by weight of the first monomer. When the amount of the vinyl group-containing compound is within the range above one or more of the following may result; the viscosity of the ink composition may remain relatively constant, an acceleration of the curing reaction speed, and a minimization or prevention of degradation of physical properties and/or adhesion properties of a given film.

For example, in the case of an ink composition that does not include a vinyl group-containing compound and is cured by a ring-opening polymerization mechanism, the curing reaction speed is slower than the acryl radical polymerization mechanism. Thus, the time required for curing may be long, and consequently, the process time may also be long, resulting in low productivity. However, in the case of the ink composition disclosed herein that includes the vinyl group-containing compound, even though the curing is performed by the ring-opening polymerization mechanism, the time required for the curing may be shortened resulting in an improvement of productivity. In addition, because the vinyl group-containing compound may lower the viscosity of the ink composition, the possibility for inkjet processability may be improved.

In an embodiment, the ink composition may include a solvent in an amount of less than about 2 parts by weight based on 100 parts by weight of the ink composition. In one or more embodiments, the ink composition may substantially not include a solvent. In one or more embodiments, the ink composition may be a solventless ink composition.

When the ink composition does not include a solvent, the ink composition may be suitable for application to an inkjet process. Specifically, in the case of an ink composition including a solvent, to form a film with a target thickness, an inkjet process needs to be performed after drying until the thickness is about five times a thickness of a film formed using the solventless ink composition. In this regard, such an ink composition including a solvent is not suitable for precise film formation, and problems, for example, color mixture between pixels during formation of a color conversion member may occur. In addition, when an ink composition including a solvent is used, phenomena of nozzle drying by solvent volatilization, nozzle clogging, and the like may occur. Also, an organic solvent may remain in a formed film so that deterioration of other organic layers may be affected or reliability may be adversely affected by out-gassing.

In an embodiment, the ink composition may further include a polymerization initiator. For example, the ink composition may further include a photopolymerization initiator and/or a thermal polymerization initiator. Such a polymerization initiator is to accelerate polymerization and improve a curing speed, and any polymerization initiator known in the art may be used without particular limitation.

In an embodiment, examples of the photopolymerization initiator are: an onium-type photopolymerization initiator consisting of a cation moiety including aromatic sulfonium, aromatic iodinium, aromatic diazonium, aromatic ammonium, and the like and an anion moiety including $BF_4^-$, $PF_6^-$, $SbF_6^-$, and the like; or a non-ionic photopolymerization initiator, such as nitrobenzyl ester, sulfonic acid derivative, phosphoric acid ester, phenolsulfonic acid ester, diazonaphthoquinone, N-hydroxyimidesulfonate, and the like.

Examples of the onium-type photopolymerization initiator including aromatic sulfonium are bis(4-(diphenylsulfonio)phenyl)sulfide bishexafluorophosphate, bis(4-(diphenylsulfonio)phenyl)sulfide bishexafluoroantimonate, bis(4-(diphenylsulfonio) phenyl)sulfide bistetrafluoroborate, bis(4-(diphenylsulfonio)phenyl)sulfide tetrakis(pentafluorophenyl)borate, diphenyl-4-(phenylthio)phenylsulfonium hexafluorophosphate, diphenyl-4-(phenylthio)phenylsulfonium hexafluoro antimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis (pentafluorophenyl)borate, bis(4-(di(4-(2-hydroxyethoxy))phenylsulfonio)phenyl)sulfide bishexafluorophosphate, bis(4-(di(4-(2-hydroxyethoxy))phenylsulfonio)phenyl)sulfide bishexafluoroantimonate, bis(4-(di(4-(2-hydroxyethoxy))phenylsulfonio)phenyl)sulfide bistetrafluoroborate, bis(4-(di(4-(2-hydroxyethoxy))phenylsulfonio)phenyl)sulfide tetrakis(pentafluorophenyl)borate, and the like, but embodiments of the present disclosure are not limited thereto.

Examples of the onium-type photopolymerization initiator including aromatic iodinium are diphenyliodinium hexafluorophosphate, diphenyliodinium hexafluoroantimonate, diphenyliodinium tetrafluoroborate, diphenyliodinium tetrakis (pentafluorophenyl)borate, bis(dodecylphenyl)iodinium hexafluorophosphate, bis(dodecylphenyl) iodinium hexafluoroantimonate, bis(dodecylphenyl) iodinium tetrafluoroborate, bis(dodecylphenyl)iodinium tetrakis(pentafluorophenyl)borate, 4-methylphenyl-4-(1-methylethyl)phenyliodinium hexafluorophosphate, 4-methylphenyl (1-methylethyl) phenyliodinium hexafluoroantimonate, 4-methylphenyl-4-(1-methylethyl)phenyliodinium tetrafluoroborate, 4-methylphenyl-4-(1-methylethyl)phenyliodinium tetrakis(pentafluorophenyl)borate, and the like, but embodiments of the present disclosure are not limited thereto.

Examples of the onium-type photopolymerization initiator including aromatic diazonium are phenyldiazonium hexafluorophosphate, phenyldiazonium hexafluoro antimonate, phenyldiazonium tetrafluoroborate, phenyldiazonium tetrakis(pentafluorophenyl)borate, and the like, but embodiments of the present disclosure are not limited thereto.

Examples of the onium-type photopolymerization initiator including aromatic ammonium are 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyanopyridinium hexafluorophosphate, 1-(naphthylmethyl)-2-cyanopyridinium hexafluoroantimonate, 1-(naphthylmethyl)-2-cyanopyridinium tetrafluoroborate, 1-(naphthylmethyl)-2-cyanopyridinium tetrakis(pentafluorophenyl) borate, and the like, but embodiments of the present disclosure are not limited thereto.

The commercially available photopolymerization initiator may be: for example, DTS-200 manufactured by Midori Company; UVI6990 or UVI6974 manufactured by Union Carbide Company; SP-150 or SP-170 manufactured by Adeca Company; FC-508 or FC-512 manufactured by 3M Company; Omnicat® 250, Omnicat® 261, Omnicat® 270, or Omnicat® 290 manufactured by IGM Resin Company, BLUESIL® PI2074 manufactured by Bluestar Silicones Company; CPI-100P, CPI-101A, CPI-200K, or CPI-210S manufactured by SAN-APRO Company, or the like.

In an embodiment, an example of the thermal polymerization initiator is an onium-type thermal polymerization initiator consisting of a cation moiety including sulfonium, phosphonium, diazonium, iodinium, ammonium, and the like and an anion moiety including $BF_4^-$, $PF_6^-$, $SbF_6^-$, and the like.

Examples of the onium-type thermal polymerization initiator including sulfonium are triphenylsulfonium tetrafluoroborate, triphenylsulfonium hexafluoroantimonate, triphenylsulfonium hexafluoroarsenic, tri(4-methoxyphenyl) sulfonium hexafluoroarsenic, diphenyl(4-phenylthiophenyl) sulfonium hexafluoroarsenic, and the like, but embodiments of the present disclosure are not limited thereto.

Examples of the onium-type thermal polymerization initiator including phosphonium are ethyltriphenylphosphonium hexafluoroantimonate, tetrabutylphosphonium hexafluoroantimonate, and the like, but embodiments of the present disclosure are not limited thereto.

Examples of the onium-type thermal polymerization initiator including ammonium are dimethylphenyl(4-methoxybenzyl)ammonium hexafluorophosphate, dimethylphenyl(4-methoxybenzyl)ammonium hexafluoroantimonate, dimethylphenyl(4-methoxybenzyl)ammonium tetrakis(pentafluorophenyl)borate, dimethylphenyl(4-methylbenzyl)ammonium hexafluorophosphate, dimethylphenyl(4-methylbenzyl) ammonium hexafluoroantimonate, dimethylphenyl (4-methylbenzyl)ammonium hexafluorotetrakis (pentafluorophenyl)borate, methylphenyldibenzylammonium hexafluoroantimonate, methylphenyldibenzylammonium hexafluorophosphate, methylphenyldibenzylammonium tetrakis(pentafluorophenyl) borate, phenyltribenzylammoniumtetrakis(pentafluorophenyl) borate, dimethylphenyl(3,4-dimethylbenzyl) ammonium tetrakis(pentafluorophenyl)borate, N,N-dimethyl-N-benzylanilinium hexafluoroantimonate, N,N-diethyl-N-benzylanilinium tetrafluoroborate, N,N-dimethyl-N-benzylpyridinium hexafluoroantimonate, N,N-diethyl-N-benzylpyridinium trifluoromethanesulfonic acid, and the like, but embodiments of the present disclosure are not limited thereto.

The commercially available thermal polymerization initiator may be: for example, Opton® CP-66 or Opton® CP-77 manufactured by ADEKA; SAN-AID® SI-60, SAN-AID® SI-80, SAN-AID® SI-100, SAN-AID® SI-110, or SAN-AID® SI-180 manufactured by SANSHIN; or CXC-1612, CXC-1738, or CXC-1821 manufactured by KING INDUSTRIES.

In an embodiment, the ink composition may include, as the polymerization initiator, sulfonium or iodinium.

In an embodiment, an amount of the polymerization initiator may be, based on 100 parts by weight of the ink composition, in a range of about 0.1 parts by weight to about 10 parts by weight, and for example, about 0.5 parts by weight to about 5 parts by weight. In one or more embodiments, the amount of the polymerization initiator may be, based on 100 parts by weight of the first monomer and the second monomer, in a range of about 0.1 parts by weight to about 10 parts by weight, and for example, about 0.5 parts by weight to about 5 parts by weight. In one or more embodiments, the amount of the polymerization initiator may be, based on 100 parts by weight of the first monomer to the third monomer, in a range of about 0.1 parts by weight to about 10 parts by weight, and for example, about 0.5 parts by weight to about 5 parts by weight. When the amount of the polymerization initiator is within the ranges above, a working speed may be sufficient and non-uniformity of a film may be reduced as a result of an excessively fast curing reaction.

In an embodiment, the ink composition may include a quantum dot. The quantum dot is not particularly limited as long as it absorbs and emits light, and examples of the quantum dot include: a Group II-VI semiconductor compound; a Group III-V semiconductor compound; a Group III-VI semiconductor compound; a Group semiconductor compound; a Group IV-VI semiconductor compound; a Group IV element or compound; or any combination thereof.

Examples of the Group II-VI semiconductor compound are: a binary compound, such as CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the Group III-V semiconductor compound are: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. The Group III-V semiconductor compound may further include a Group II element. Examples of the Group III-V semiconductor compound further including a Group II element are InZnP, InGaZnP, InAlZnP, and the like Examples of the Group III-VI semiconductor compound are: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of the Group I-III-VI semiconductor compound are: a ternary compound, such as AgInS, $AgInS_2$, CuInS, $CuInS_2$, $CuGaO_2$, $AgGaO_2$, $AgAlO_2$, and the like; or any combination thereof.

Examples of the Group IV-VI semiconductor compound are: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

The Group IV element or compound may include: a single element compound, such as Si, Ge, and the like; a binary compound, such as SiC, SiGe, and the like; or any combination thereof.

Each element included in a multi-element compound, such as the binary compound, the ternary compound, and the quaternary compound, may exist in a particle thereof at a uniform concentration or a non-uniform concentration.

The quantum dot may have: a homogeneous single structure; dual structure, such as a core-shell structure, a gradient structure, and the like; a core-shell-shell triple structure; or a mixed structure thereof. For example, a material included in the core and a material included in the shell may be different from each other.

Examples of the shell of the quantum dot are a metal oxide, a metalloid oxide, a non-metal oxide, a semiconductor compound, or any combination thereof. Examples of the metal oxide, the metalloid oxide, or the non-metal oxide are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof. Examples of the semiconductor compound are: as described herein, a Group II-VI semiconductor compound; a Group III-V semiconductor compound; a Group III-VI semiconductor compound; a Group I-III-VI semiconductor compound; a Group IV-VI semiconductor compound; or any combination thereof.

In an embodiment, the core may include one or more materials selected from CdSe, CdS, InP, InGaP, ZnS, ZnSe, CdTe, CdSeTe, CdZnS, PbSe, AgInZnS, and ZnO, but embodiments of the present disclosure are not limited thereto.

In an embodiment, the shell may include one or more materials selected from CdSe, ZnSe, ZnS, ZnTe, CdTe, PbS, TiO, SrSe, and HgSe, but embodiments of the present disclosure are not limited thereto.

The quantum dot may include on a surface thereof one or more ligands, and each of the one or more ligands may include one or more polar moieties. In this regards, the monomers included in the ink composition have relatively high polarity. Therefore, when the polarity of the quantum dot is low, homogeneous disperse of quantum dot in the ink composition may be difficult. Thus, to increase the polarity of the quantum dot a ligand including one or more polar moieties may be used.

In an embodiment, the polar moiety may include an oxyalkylene group. In one or more embodiments, the polar moiety may include a substituted or unsubstituted oxymethylene group or a substituted or unsubstituted oxyethylene group.

In one or more embodiments, the polar moiety may include tetramethoxyethylene glycol.

In an embodiment, the quantum dot and the ligand may be chemically bonded via at least one group selected from a hydroxy group, a mercapto group, a carboxyl group, an ester group, and a phosphoric acid group.

In an embodiment, the ligand may further include a linear or branched $C_1$-$C_{20}$ alkane group, a cyclic $C_3$-$C_{20}$ alkane group, a linear or branched $C_2$-$C_{20}$ alkene group, or a cyclic a $C_3$-$C_{20}$ alkene group, a $C_6$-$C_{20}$ arene group, or a $C_1$-$C_{20}$ heteroarene group.

The quantum dot may be prepared by steps including: dispersing in a non-polar solvent a quantum dot including on a surface thereof a polar moiety-free ligand; adding a polar moiety-including ligand and stirring the mixed dispersion; and extracting the supernatant by centrifugation and drying it to obtain a quantum dot including one or more ligands including one or more polar moieties on a surface of the quantum dot.

In an embodiment, an amount of the quantum dot may be, based on 100 parts by weight of the ink composition, in a range of about 20 parts by weight to 60 parts by weight, for example, about 25 parts by weight to about 50 parts by weight, and for example, about 30 parts by weight to about 45 parts by weight.

In an embodiment, the ink composition may further include a scatterer. The scatterer is not limited as long as it scatters and/or diffuses light that is not absorbed by the quantum dot, and allows the scattered light to be absorbed again by a quantum dot. That is, the scatterer may increase the amount of light absorbed by a quantum dot so as to increase light conversion efficiency of a color conversion layer.

In an embodiment, the scatterer may include a plurality of inorganic particles having different particle diameters.

In an embodiment, the scatterer may include $BiFeO_3$, $Fe_2O_3$, $WO_3$, $TiO_2$, SiC, $BaSO_4$, $BaTiO_3$, ZnO, $ZrO_2$, ZrO, $Ta_2O_5$, $MoO_3$, $TeO_2$, $Nb_2O_5$, $Fe_3O_4$, $V_2O_5$, $Cu_2O$, BP, $Al_2O_3$, $In_2O_3$, $SnO_2$, $Sb_2O_3$, $CaCO_3$, and ITO, or any combination thereof.

In an embodiment, an average particle diameter of the scatterer may be in a range of about 150 nanometers (nm) to about 250 nm, for example, about 180 nm to about 230 nm. When the average particle diameter of the scatterer is within these ranges, the light scattering effect may be improved and the light conversion efficiency of the light conversion layer may be increased.

In an embodiment, the scatterer may have a refractive index of greater than 1.5.

As described above, the scatterer may include inorganic particles having various particle diameters, so that the refractive index of the scatterer may increase. In this regard, a difference in the refractive index between the scatterer and surrounding members may also increase. Accordingly, the probability of total reflection of blue light may increase, thereby increasing an absorption rate of blue light and improving light conversion efficiency.

In an embodiment, an amount of the scatterer may be, based on 100 parts by weight of the ink composition, in a range of about 0.1 parts by weight to about 20 parts by weight, for example, about 1 parts by weight to about 10 parts by weight. When the amount of the scatterer is within these ranges, use of the scatterer may result in the improved light conversion efficiency. Also, due to the inclusion of the quantum dots at an appropriate weight ratio, the light conversion efficiency does not decrease.

In an embodiment, the ink composition may further include various additives, and thus, the ink composition may undergo various modifications. In an embodiment, the ink composition may include, as an additive, a surfactant, an adhesion promoter, a sensitizer, a stabilizer, or any combination thereof.

In one or more embodiments, the ink composition may further include a surfactant, such as a fluorine-based surfactant or a silicone-based surfactant, to improve coating properties and leveling performance.

The fluorine-based surfactant may have a weight average molecular weight in a range of about 4,000 g/mol to about 10,000 g/mol, for example, about 6,000 g/mol to about 10,000 g/mol. Also, the fluorine-based surfactant may have a surface tension in a range of about 18 mN/m to about 23 mN/m (measured in 0.1% propylene glycol monomethylether acetate (PGMEA) solution). When the weight average molecular weight and the surface tension of the fluorine-based surfactant are within these ranges, leveling performance may be further improved, occurrence of stains during coating may be prevented, and relatively less bubbles are generated, resulting in fewer film defects.

The commercially available fluorine-based surfactant may include: for example, MEGAFACE® product line manufactured by DIC Company, such as F-114, F-251, F-253, F-281, F-410, F-430, F-477, F-510, F-551, F-552, F-553, F-554, F-555, F-556, F-557, F-558, F-559, F-560, F-561, F-562, F-563, F-565, F-568, F-569, F-570, F-572, F-574, F-575, F-576, R-4, R-41, R-94, RS-56, RS-72-K, RS-75, RS-76-E, RS-76-NS, RS-78, RS-90, or DS-21; Fluorosurfactant® product line manufactured by 3M Company, such as FC-135, FC-170C, FC-430, FC-431, FC-4430, or FC-4433; SURFLON® product line manufactured by AGC Company, such as S-211, S-221, S-231, S-232, S-241, S-242, S-243, S-420, S-431, S-386, S-611, S-647, S-651, S-653, S-656, S-658, F693; or CPASTONE® product line manufactured by DuPont Company, such as FS-30, FS-65, FS-31, FS-3100, FS-34, FS-35, FS-50, FS-51, FS-60, FS-61, FS-63, FS-64, FS-81, FS-22, or FS-83; and the like, but embodiments of the present disclosure are not limited thereto.

For example, the surfactant may include a silicon-based surfactant. The commercially available silicon-based surfactant may include: for example, DYNOL product line manufactured by Evonik Company, such as DYNOL® 360, DYNOL® 604, DYNOL® 607, DYNOL® 800, or DYNOL® 810, and TEGO® product line manufactured by the same company, such as Twin 4000, Twin 4100, or Twin 4200; BYK-300, BYK-301, BYK-302, BYK-306, BYK-307, BYK-310, BYK-313, BYK-315N, BYK-320, BYK-322, BYK-323, BYK-325N, BYK-326, BYK-327, BYK-329, BYK-330, BYK-331, BYK-332, BYK-333, BYK-342, BYK-345, BYK-346, BYK-347, BYK-348, BYK-350, BYK-352, BYK-354, BYK-355, BYK-356, BYK-358N, BYK-359, BYK-360P, BYK-361N, BYK-364P, BYK-366P, BYK-368P, BYK-370, BYK-375, BYK-377, BYK-378, BYK-381, BYK-390, BYK-392, or BYK-394 manufactured by BYK Company; and the like, but embodiments of the present disclosure are not limited thereto.

An amount of the surfactant may be, based on 100 parts by weight of the ink composition, in a range of about 0.01 parts by weight to about 5 parts by weight, for example, about 0.1 parts by weight to about 2 parts by weight.

In an embodiment, the ink composition may further include an adhesion promoter.

The adhesion promoter may include, for example, a titanium-based adhesion promoter, an aluminum-based adhesion promoter, or a silane-based adhesion promoter.

Examples of the silane-based adhesion promoter are: an epoxy-based silane binder, such as 3-glycidyloxypropyl trimethoxysilane, 3-glycidyloxypropyl triethoxysilane, 3-glycidyloxypropyl (dimethoxy)methylsilane, or 2-(3,4-epoxycyclohexyl)ethyl trimethoxysilane; a mercapto-based silane binder, such as 3-mercaptopropyl trimethoxysilane, 3-mercaptopropyl triethoxysilane, 3-mercaptopropyl methyldimethoxysilane, or 11-mercaptoundecyl trimethoxysilane; an amino-based silane binder, such as 3-aminopropyl trimethoxysilane, 3-aminopropyl triethoxysilane, 3-aminopropyl dimethoxymethylsilane, N-phenyl-3-aminopropyl trimethoxysilane, N-methylaminopropyl trimethoxysilane, N-(2-aminoethyl)-3-aminopropyl trimethoxysilane, or N-(2-aminoethyl)-3-aminopropyl dimethoxymethylsilane; a ureid-based silane binder, such as 3-ureid propyl triethoxysilane; a vinyl-based silane binder, such as vinyl trimethoxysilane, vinyl triethoxysilane, or vinyl methyldiethoxy silane; a styryl-based silane binder, such as p-styryl trimethoxysilane; an acrylate-based silane binder, such as 3-acryloxypropyl trimethoxysilane or 3-metacryloxypropyl trimethoxysilane; an isocyanate-based silane binder such as 3-isocyanate propyl trimethoxysilane; a sulfide-based silane binder, such as bis(triethoxysilylpropyl)disulfide or bis(triethoxysilylpropyl)tetrasulfide; phenyl trimethoxysilane; methacryloxypropyl trimethoxysilane; imidazolesilane; triazinesilane; and the like, but embodiments of the present disclosure are not limited thereto. The commercially available adhesion promoter may be: for example, KBM-1003, KBE-1003, KBM-303, KBM-402, KBM-403, KBE-402, KBE-403, KBM-1403, KBM-502, KBM-503, KBE-502, KBE-503, KBM-5103, KBM602, KBM-603, KBM-903, KBE-903, KBE-9103P, KBM-573, KBM-575, KBE-585, KBE-9007N, KBM-9659, KBM-802, or KBM-803 manufactured by Shin Etsu Company; SIA02000.0, SIS6964.0, SIA08591.0, SIS6964.0, SIB1824.5, SIA0591.0, SIT8192.6, SIG5840.0, SIB1834.0, SIE4668.0, SIA0599.2, SIC2295.5, SIB1833.0, SIA0611.0, SIG5840.0, SIB1140.0, SIB1833.0, SIS6990.0, SIB1832.0, SIE4670.0, SIM6487.4, SIB1828.0, SIM6487.4, SIS6994.0, SIB1140.0, SIM6476.0, SIU9058.0, SII6455.0, SIT8717.0, SSP-055, SIA0780.0, or VEE-005 manufactured by Gelest Company; SA6112C, SA1003O, SA0004O, SA3003O, SA4003O, SA1003M, SB1003M, SB1013E, SB1022M, SB2003M, or SB3003M manufactured by KCC Company; and the like, but embodiments of the present disclosure are not limited thereto.

In an embodiment, an amount of the adhesion promoter may be, based on 100 parts by weight of the ink composition, in a range of about 0.1 parts by weight to about 10 parts by weight, for example, about 0.5 parts by weight to about 5 parts by weight. In one or more embodiments, the amount of the adhesion promoter may be, based on 100 parts by weight of the total amounts of the first monomer and the second monomer in the ink composition, in a range of about 0.1 parts by weight to about 10 parts by weight, for example, about 0.5 parts by weight to about 5 parts by weight. In one or more embodiments, the amount of the adhesion promoter may be, based on 100 parts by weight of the total amounts of the first monomer, the second monomer, and the third monomer in the ink composition, in a range of about 0.1 parts by weight to about 10 parts by weight, for example, about 0.5 parts by weight to about 5 parts by weight.

In an embodiment, the ink composition may further include a sensitizer. The sensitizer may further improve polymerization initiation efficiency of the polymerization initiator, and thus may serve to further accelerate a curing reaction of the ink composition.

The sensitizer may serve to supplement curability of rays having a long wavelength of 300 nm or more. The sensitizer may be a compound that absorbs light having a wavelength in a range of about 250 nm to about 405 nm, about 300 nm to about 405 nm, or about 350 nm to about 395 nm.

Examples of the sensitizer are: an anthracene-based compound, such as 9,10-dimethoxyanthracene, 9,10-diethoxyanthracene, 9,10-dibutoxyanthracene, or 2-ethyl-9,10-dimethoxyanthracene; a benzophenone-based compound, such as 4,4-bis(dimethylamino)benzophenone, 4,4-bis(diethylamino) benzophenone, 2,4,6-trimethylaminobenzophenone, methyl-o-benzoyl benzoate, 3,3-dimethyl-4-methoxybenzophenone, or 3,3,4,4-tetra(t-butylperoxycarbonyl)benzophenone; a ketone-based compound, such as dimethoxyacetophenone, diethoxy acetophenone, 2-hydroxy-2-methyl-1-phenylpropane-1-one, or propanone; a fluorenone-based compound, such as 9-fluorenone, 2-chloro-9-fluorenone, or 2-methyl-9-fluorenone; a thioxanthone-based compound, such as thioxanthone, 2,4-diethyl thioxanthone, 2-chloro thioxanthone, 1-chloro-4-propyloxy thioxanthone, isopropyl thioxanthone (ITX), or diisopropyl thioxanthone; a xanthone-based compound, such as xanthone or 2-methyl xanthone; an anthraquinone-based compound, such as anthraquinone, 2-methyl anthraquinone, 2-ethyl anthraquinone, t-butyl anthraquinone, or 2,6-dichloro-9,10-anthraquinone; an acridine-based compound, such as 9-phenylacridine, 1,7-bis(9-acrydinyl)heptane, 1,5-bis(9-acrydinylpentane), or 1,3-bis(9-acrydinyl)propane; a dicarbonyl compound, such as benzyl, 1,7,7-trimethyl-bicyclo[2,2,1]heptane-2,3-dione, or 9,10-phenanthrenequinone; a phosphine oxide-based compound, such as 2,4,6-trimethylbenzoyl diphenylphosphine oxide or bis(2,6-dimethoxybenzoyl)-2,4,4-trimethylpentyl phosphine oxide; a benzoate-based compound, such as methyl-4-(dimethylamino)benzoate, ethyl-4-(dimethylamino) benzoate, or 2-n-butoxyethyl (dimethylamino)benzoate; an amino-based compound, such as 2,5-bis(4-diethylaminobenzal)cyclopentanone, 2,6-bis(4-diethylaminobenzal)cyclohexanone, or 2,6-bis(4-diethylaminobenzal)-4-methyl-cyclopentanone; a coumarin-based compound, such as 3,3-carbonylvinyl-7-(diethylamino)coumarin, 3-(2-benzothiazolyl)-7-(diethylamino)coumarin, 3-benzoyl-7-(diethylamino) coumarin, or 3-benzoyl-7-methoxy-coumarin; a chalcone compound, such as 4-diethylamino chalcone or 4-azidebenzalacetophenone; 2-benzoylmethylen; 3-methyl-beta-naphthothiazoline; and the like, but embodiments of the present disclosure are not limited thereto.

An amount of the sensitizer may be, based on 100 parts by weight of the ink composition, in a range of about 0.05 parts by weight to about 3 parts by weight, for example, about 0.1 parts by weight to about 1 parts by weight. When the amount of the sensitizer is within these ranges, sensitization effect may be sufficiently obtained and light in the curing process may be transmissible at deeper regions of the applied ink composition.

In an embodiment, the ink composition may further include a stabilizer, such as an antioxidant, a UV absorber, and/or an anti-aggregation agent. The stabilizer may be used to improve the long-term stability of the ink composition.

Examples of the antioxidant are 2,6-di-t-butyl-4-methylphenol, 3,5-di-t-butyl-4-hydroxybenzaldehyde, 2-t-butyl-4-methoxyphenol, 1,3,5-tris[(4-t-butyl-3-hydroxy-2,6-dimethylphenyl)methyl]-1,3,5-triazine-2,4,6-trione, [3-[3-(3,5-di-t-butyl-4-hydroxyphenyl) propanoyloxy]-2,2-bis[3-(3,5-di-t-butyl-4-hydroxyphenyl)propanoyloxymethyl]propyl]3-(3,5-di-t-butyl-4-hydroxyphenyl)propanoate, [3-[3-(3,5-dit-butyl-4-hydroxyphenyl) propanoyloxy]-2,2-bis[3-(3,5-dit-butyl-4-hydroxyphenyl)propanoyloxymethyl]propyl]3-(3,5-di-t-butyl-4-hydroxyphenyl)propanoate, octadecyl-3-(3,5-di-t-butyl-4-hydroxyphenyl) propanoate, tris(2,4-di-t-butylphenyl) phosphite, (4,4'-thio-bis(2-t-butyl-5-methylphenol, 2,2'-thiobis(4-methyl-6-t-butylphenol), 2,6-di-t-butyl-4-methylphenol, and the like, but embodiments of the present disclosure are not limited thereto.

Examples of the UV absorber are 2-(3-t-butyl-2-hydroxy-5-methylphenyl)-5-chlorobenzotyriazole, alkoxybenzophenone bis(2,2,6,6-tetramethylpiperidine-4-yl)decandionate, 2-hydroperoxy-2-methylpropane, bis(3,3,5,5-tetramethylpiperidine-4-yl)decandionate, 4-methylhexyl-3-[3-(benzotyriazole-2-yl)-5-t-butyl-4-hydroxyphenyl] propanoate, and the like, but embodiments of the present disclosure are not limited thereto.

Examples of the anti-aggregation agent are polyacrylic acid sodium and the like, but embodiments of the present disclosure are not limited thereto.

An amount of the stabilizer may be, based on 100 parts by weight of the ink composition, in a range of about 0.05 parts by weight to about 10 parts by weight, for example, about 0.1 parts by weight to about 5 parts by weight, and for example, about 0.1 parts by weight to about 3 parts by weight.

The viscosity of the ink composition may be 80 millipascals second (mPa·s) or less at 25° C. For example, the viscosity may be in a range of about 1 mPa·s to about 80 mPa·s, and for example, about 5 mPa·s to about 40 mPa·s. The ink composition having the viscosity within these ranges may be suitable for manufacturing a film according to a solution process such as an inkjet printing method.

The surface tension of the ink composition may be in a range of about 10 dynes/cm to about 40 dynes/cm at room temperature. The ink composition having the surface tension within these ranges may be suitable for manufacturing a film according to a solution process such as an inkjet printing method.

The ink composition may pass through a filter having a pore size of 20 micrometers (μm) or less, for example, 5 μm or less.

Film

Hereinafter, a film formed using the ink composition will be described.

A film may be formed by curing the ink composition. That is, the film may include a cured product of the ink composition.

In an embodiment, the film may be formed by steps including: providing the ink composition on a substrate to form a pattern thereon; and curing the pattern.

In an embodiment, the providing of the ink composition to form the pattern may be performed by a solution process. The solution process may include an inkjet printing method, a spin coating method, a slit coating method, a drop casting method, a casting method, a gravure coating method, a bar coating method, a roll coating method, a dip coating method, a spray coating method, a screen coating method, a flexographic printing method, an offset printing method, or a nozzle printing method, but embodiments of the present disclosure are not limited thereto.

In an embodiment, the solution process may be performed by an inkjet printing method, but embodiments of the present disclosure are not limited thereto. For example, the ink composition may be provided in the form of micro-droplets on the substrate by the inkjet printing method. More particularly, micro-droplets of the ink composition may be sprayed on a predetermined area of the substrate. In detail, the ink composition may be provided on the substrate to a thickness in a range of about 0.5 μm to about 20 μm by the inkjet printing method.

Since the ink composition has excellent inkjet ejection stability, the ink composition may be suitably used for the inkjet printing method.

To perform the inkjet printing method, an inkjet printer having an inkjet head mounted with a piezo-type nozzle that applies pressure according to a voltage may be used.

In detail, the ink composition may be ejected from the nozzle of the inkjet head onto the substrate.

Here, an ejection amount of the ink composition may be in a range of about 1 picoliter per one ejection (drop) (pL/ejection) to about 80 pL/ejection, for example, about 1 pL/ejection to about 30 pL/ejection, and for example, about 1 pL/ejection to about 20 pL/ejection.

To minimize clogging of the nozzle and improve the degree of ejection precision, an aperture diameter of the inkjet head may be in a range of about 5 μm to about 50 μm, for example, about 10 μm to about 30 μm, but embodiments of the present disclosure are not limited thereto.

Shear rate at the inkjet head at ejection may be in a range of about 1,000 $s^{-1}$ to about 100,000 $s^{-1}$, but embodiments of the present disclosure are not limited thereto.

A temperature at the time of ejection may be, although not particularly limited, in a range of about 10° C. to about 120° C., about 15° C. to about 60° C., about 15° C. to about 40° C., or about 20° C. to about 35° C., in terms of suppressing crystallization of a material included in the ink composition.

In an embodiment, the curing of the pattern may be performed by a photocuring process or a thermosetting process. However, when an organic compound vulnerable to heat is adjacent to the pattern, a photocuring process may be preferred. In one or more embodiments, the curing of the pattern may be performed by irradiating light having an intensity in a range of about 1 watt (W) to about 500 W and/or a wavelength in a range of about 250 nm to about 450 nm, but embodiments of the present disclosure are not limited thereto.

In an embodiment, the substrate may be an electrode of a light-emitting device, but embodiments of the present disclosure are not limited thereto.

In an embodiment, the ink composition may be provided on an electrode to a thickness in a range of about 1 μm to about 100 μm, for example, about 5 μm to about 20 μm.

Electronic Apparatus

Hereinafter, an electronic apparatus including the above-described film will be described.

Another aspect of the present disclosure provides an electronic apparatus including: the film; and a light-emitting device including a first electrode, a second electrode, and an interlayer between the first electrode and the second electrode.

In an embodiment, the electronic apparatus may include a liquid crystal display apparatus, an organic light-emitting display apparatus, or an inorganic light-emitting display apparatus.

For example, when the electronic apparatus further includes liquid crystal, the electronic apparatus may be a liquid crystal display apparatus. Accordingly, the light-emitting device may act as a light source, and the film may be included and arranged outside the light-emitting device—the liquid crystal to act as a color conversion member.

In one or more embodiments, when the interlayer of the light-emitting device includes an emission layer, and the emission layer includes an organic material, the electronic apparatus may be an organic light-emitting display apparatus. Accordingly, the light-emitting device may act as a light source, and the film may be included and arranged outside the light-emitting device as a color conversion member.

In one or more embodiments, when the interlayer of the light-emitting device includes an emission layer, and the emission layer includes an inorganic material, such as in the film, the electronic apparatus may be an inorganic light-emitting display apparatus. Accordingly, the light-emitting device may act as a light source, and the film may be included and arranged outside the light-emitting device to act as a color conversion member.

The electronic apparatus may further include a thin-film transistor in addition to the above-described light-emitting device. The thin-film transistor may include a source electrode, a drain electrode, and an activation layer, wherein one of the source electrode or the drain electrode may be electrically connected to any one of the first electrode or the second electrode of the light-emitting device.

The thin-film transistor may further include a gate electrode, a gate insulating film, or the like.

The activation layer may include crystalline silicon, amorphous silicon, an organic semiconductor, an oxide semiconductor, or the like.

The electronic apparatus may further include a sealing portion for sealing the light-emitting device. The sealing portion allows light from the light-emitting device to be extracted to the outside, and simultaneously prevents ambient air and moisture from penetrating into the light-emitting device. The sealing portion may be a sealing substrate including a transparent glass substrate or a plastic substrate. The sealing portion may be a thin-film encapsulation layer including at least one of an organic layer and/or an inorganic layer. When the sealing portion is a thin-film encapsulation layer, the electronic apparatus may be flexible.

Various functional layers may be additionally arranged on the sealing portion according to use of the electronic apparatus. Examples of the functional layer are a color filter, a color conversion layer, a touch screen layer, a polarizing layer, and the like. The touch screen layer may be a pressure-sensitive touch screen layer, a capacitive touch screen layer, or an infrared touch screen layer.

Hereinafter, an electronic apparatus 3 according to an embodiment will be described in detail with reference to FIG. 1.

The electronic apparatus 3 includes a light-emitting device 320 and a first substrate 340. A film may be included and arranged outside the light-emitting device 320 (that is, on a first electrode and/or a second electrode). In detail, the film may be on the first substrate 340 arranged outside the light-emitting device 320. The first substrate 340 may act as a color conversion member, and the light-emitting device 320 may act as a light source.

The light-emitting device 320 may include a first electrode 321, a second electrode 323, and an interlayer 322 between the first electrode 321 and the second electrode 323.

The electronic apparatus 3 may be an organic light-emitting display apparatus. In this regard, the light-emitting device 320 may include an organic emission layer in the interlayer 322. The interlayer 322 may comprise multiple layers generally known in the OLED art.

A pixel-defining layer 330 may be arranged on the first electrode 321. The pixel-defining layer 330 exposes a predetermined region of the first electrode 321, and the interlayer 322 may be arranged on the exposed region.

In an embodiment, one region 341 of the first substrate 340 may include the film. Accordingly, the first substrate 340 may be arranged in a location where light emitted from the light-emitting device 320 comes in contact with the film. That is, the film may be arranged outside the light-emitting device 320 and in the direction path of light emitted from the light-emitting device 320.

The film may absorb first-color light and emits second-color light. Accordingly, the first substrate 340 may be designed to absorb first-color light and emit second-color light selected from a wide color range.

In an embodiment, the first substrate 340 may further include a scatterer.

In an embodiment, the first substrate 340 may include a plurality of subpixel areas spaced apart from each other. The first substrate 340 may include: a first region emitting first-color light; a second region emitting second-color light; and/or a third region emitting third-color light, wherein the first region, the second region, and/or the third region correspond to each of the plurality of subpixel areas, and the first-color light, the second-color light, and/or the third-color light may have different maximum emission wavelengths from one another. For example, the first-color light may be red light, the second-color light may be green light, and the third-color light may be blue light. At least one of the first region to the third region may correspond to the one region 341. The others not corresponding to the one region 341 among the first region to third region may be another region (not shown). The other region may not include the film, and may transmit light from a different light-emitting device (not shown).

In an embodiment, the first region may include red quantum dots, the second region may include green quantum dots, and the third region may not include quantum dots. The first region, the second region, and/or the third region may each further include a scatterer. Here, the third region may transmit light from the light-emitting device.

For example, the light-emitting device may emit first light, the first region may absorb the first light and emit first-first color light, the second region may absorb the first light and emit second-first color light, and the third region may absorb the first light and emit third-first color light. Here, the first-first color light, the second-first color light, and the third-first color light may have different maximum emission wavelengths from each other. In detail, the first light may be blue light, the first-first color light may be red light, the second-first color light may be green light, and the third-first color light may be blue light.

In an embodiment, the first substrate 340 may further include a light-shielding pattern 344 between the one region 341 and the other region.

In an embodiment, the electronic apparatus 3 may further include a second substrate 310.

Figure 2:
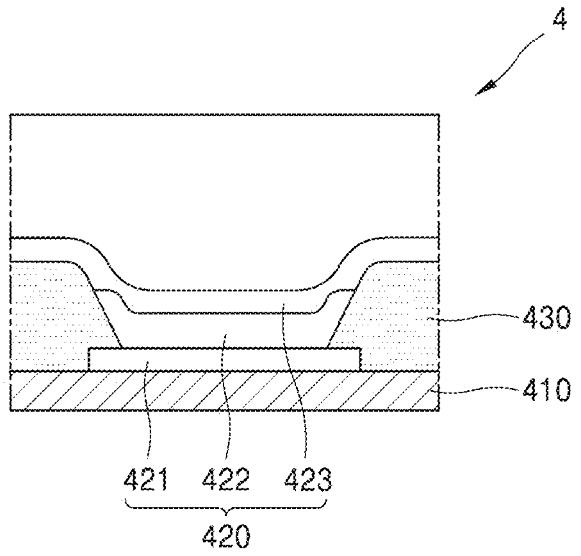
FIG. 2 is a schematic view of a light-emitting apparatus according to an embodiment.

Hereinafter, an electronic apparatus 4 according to an embodiment will be described in detail with reference to FIG. 2. The electronic apparatus 4 includes a first substrate 410 and a light-emitting device 420. The light-emitting device 420 includes a first electrode 421, a second electrode 423, and an interlayer 422 between the first electrode 421 and the second electrode 423. The electronic apparatus 4 also includes a pixel-defining layer 430 arranged on the first electrode 421. The pixel-defining layer 430 exposes a predetermined region of the first electrode 421, and the interlayer 422 may be arranged on the exposed region.

The film may be included in the interlayer 422, for example, in an emission layer included in the interlayer 422.

When an electric field is applied between the first electrode 421 and the second electrode 423, the film may emit visible light. Accordingly, the light-emitting device 420 may be designed to emit light having wavelengths in a wide color range.

The interlayer 422 may further include an auxiliary layer between the emission layer and the first electrode and/or between the emission layer and the second electrode. The auxiliary layer may directly contact the emission layer. The auxiliary layer may improve thin-film characteristics of the emission layer.

The interlayer 422 may further include a first charge transport region between the emission layer and the first electrode and/or a second charge transport region between the emission layer and the second electrode.

Figure 3:
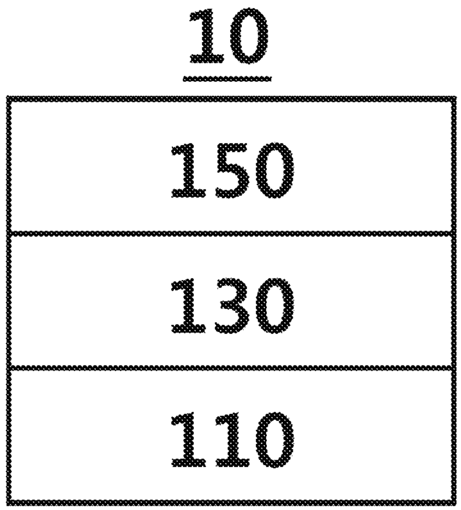
FIG. 3 is a schematic view of a light-emitting device according to an embodiment.

FIG. 3 is a schematic cross-sectional view of a light-emitting device 10. The light-emitting device 10 includes a first electrode 110, an interlayer 130, and a second electrode 150. Hereinafter, a structure and a manufacturing method of the light-emitting device 10 will be described with reference to FIG. 3. First electrode 110

In FIG. 3, a substrate may be additionally arranged under the first electrode 110 or above the second electrode 150. The first electrode 110 may be formed by, for example, depositing or sputtering a material for forming the first electrode 110 on the substrate. When the first electrode 110 is an anode, a material for forming the first electrode 110 may be a high-work function material that facilitates injection of holes. Interlayer 130

The interlayer 130 is arranged on the first electrode 110. The interlayer 130 may include an emission layer. The interlayer 130 refers to a single layer and/or a plurality of layers arranged between the first electrode 110 and the second electrode 150 in the light-emitting device 10. A material included in the interlayer 130 may be an organic material and/or an inorganic material.

The interlayer 130 may further include a hole transport region between the first electrode 110 and the emission layer, and an electron transport region between the emission layer and the second electrode 150.

The interlayer 130 may further include, in addition to various organic materials, a metal-containing compound, such as an organometallic compound, an inorganic material, such as a quantum dot, and the like.

In an embodiment, the interlayer 130 may include: i) two or more emitting units sequentially stacked between the first electrode 110 and the second electrode 150; and ii) a charge generation layer arranged between the two or more emitting units. When the interlayer 130 includes two or more emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material; ii) a single-layered structure consisting of a single layer consisting of a plurality of different materials; or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituent layers of each structure are stacked sequentially from the first electrode 110. A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage. Emission layer in interlayer 130

When the light-emitting device 10 is a full color light-emitting device, the emission layer may include emission layers emitting different colors according to individual subpixels.

For example, the emission layer may be patterned into a first color emission layer, a second color emission layer, and a third color emission layer, according to individual subpixels.

In an embodiment, at least one emission layer among the first color emission layer to the third color emission layer may include a film formed using the ink composition. In detail, the first color emission layer may be an inorganic emission layer including quantum dots, and the second color emission layer and the third color emission layer may each be an organic emission layer including an organic compound. In this regard, the first color to the third color may be different from one another, and for example, may have different maximum emission wavelengths from one another. The first color to the third color may be white when combined with one another.

In one or more embodiments, the first color emission layer, the second color emission layer, and the third color emission layer may each be an organic emission layer including an organic compound.

In one or more embodiments, the emission layer may further include a fourth color emission layer, and at least one emission layer of the first color emission layer to the fourth color emission layer may be an inorganic emission layer including quantum dots, and the others may each be an organic emission layer including an organic compound. As such, other various modifications may be provided. In this regard, the first color to the fourth color may be different colors, and for example, the first color to the fourth color may have different maximum emission wavelengths from one another. The first color to the fourth color may be white when combined with one another.

In one or more embodiments, the light-emitting device may have a stacked structure in which two or more emission layers emitting light of identical or different colors contact each other or are separated from each other. At least one emission layer of the two or more emission layers may be an inorganic emission layer including quantum dots, and the others may each be an organic emission layer including an organic compound. As such, other various modifications may be provided. In detail, the light-emitting device may include the first color emission layer and the second color emission layer, wherein the first color and the second color may be identical to or different from each other. For example, when the first color and the second color are identical to each other, the first color and the second color may each be blue. For example, when the first color and the second color are different from each other, the first color and the second color may be combined into white. For example, when the first color and the second color are different from each other, the first color may be blue, and the second color may be green or red.

When the emission layer is an organic emission layer, the emission layer may include a host and a dopant. The dopant may include a phosphorescent dopant, a fluorescent dopant, a delayed fluorescence dopant, or any combination thereof.

An amount of the host in the emission layer may be greater than that of the dopant in the emission layer. In an embodiment, the amount of the dopant in the emission layer may be in a range of about 0.01 parts by weight to about 15 parts by weight based on 100 parts by weight of the host.

When the emission layer is an inorganic emission layer, the emission layer may include quantum dots. In detail, the ink composition may include a film formed using the ink composition.

In one or more embodiments, the emission layer may include a delayed fluorescence material. The delayed fluorescence material may act as the host or the dopant in the emission layer, and depending on the purpose, may be a delayed fluorescence host or a delayed fluorescence dopant.

A thickness of the emission layer may be in a range of about 100 Å to about 1,000 Å, for example, about 200 Å to about 600 Å. When the thickness of the emission layer is within these ranges, excellent luminescence characteristics may be obtained without a substantial increase in driving voltage.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituent layers of each structure are sequentially stacked from the emission layer.

A thickness of the electron transport region may be in a range of about 160 Å to about 5,000 Å, for example, from about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are within these ranges, satisfactory electron transporting characteristics may be obtained without a substantial increase in driving voltage.

Second Electrode 150

The second electrode 150 is arranged on the above-described interlayer 130. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may have a single-layered structure or a multi-layered structure including a plurality of layers.

Capping Layer

A first capping layer may be arranged outside the first electrode 110, and/or a second capping layer may be arranged outside the second electrode 150. In detail, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

In an embodiment, light generated in the emission layer of the interlayer 130 of the light-emitting device 10 may be extracted toward the outside through the first electrode 110, which is a semi-transmissive electrode or a transmissive electrode, and the first capping layer. In one or more embodiments, light generated in the emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 may be increased, so that the luminescence efficiency of the light-emitting device 10 may be also improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

Electronic Apparatus

The light-emitting device may be included in various electronic apparatuses. In an embodiment, the electronic apparatus including the light-emitting device may be a display apparatus, a light-emitting apparatus, an authentication apparatus, or the like.

The electronic apparatus (for example, a light-emitting apparatus) may further include, in addition to the light-emitting device, i) a color filter, ii) a color conversion layer, or iii) both a color filter and a color conversion layer. The color filter and/or the color conversion layer may be arranged in at least one traveling direction of light emitted from the light-emitting device. For example, light emitted from the light-emitting device may be blue light or white light. Details for the light-emitting device are the same as described herein. In an embodiment, the color conversion layer may include quantum dots, and may be a film formed using the above-described ink composition.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The electronic apparatus may further include a thin-film transistor in addition to the above-described light-emitting device. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, or the like.

The activation layer may include crystalline silicon, amorphous silicon, an organic semiconductor, an oxide semiconductor, or the like.

The electronic apparatus may further include a sealing portion for sealing the light-emitting device. The sealing portion may be arranged between color filter and the light-emitting device and/or between the color conversion layer and the light-emitting device. The sealing portion allows light from the light-emitting device to be extracted to the outside, and simultaneously prevents ambient air and moisture from penetrating into the light-emitting device. The sealing portion may be a sealing substrate including a transparent glass substrate or a plastic substrate. The sealing portion may be a thin-film encapsulation layer including at least one of an organic layer and/or an inorganic layer. When the sealing portion is a thin-film encapsulation layer, the electronic apparatus may be flexible.

Various functional layers may be additionally arranged on the sealing portion, in addition to the color filter and/or the color conversion layer, according to use of the electronic apparatus. Examples of the functional layer are a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, and the like).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Manufacturing Method

The layers included in the hole transport region, the emission layer, and the layers included in the electron transport region may be formed in a certain region by using various methods such as vacuum deposition, spin coating, casting, Langmuir-Blodgett (LB) deposition, ink-jet printing, laser-printing, laser-induced thermal imaging, and the like.

When the layers constituting the hole transport re included in the hole transport region, the emission layer, and the layers included in the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec, depending on a material to be included in a layer to be formed and the structure of a layer to be formed.

EXAMPLES

Preparation Example 1: Preparation of Quantum Dot Including Ligand on Surface Thereof Referring to Chem. Mater. 2017, 29, 6893-6899, Part 2.2, a dispersion including InP/ZnSe/ZnS quantum dots was prepared. The dispersion was subjected to centrifugation twice, each using acetone and ethanol, and then vacuum dried so as to obtain a powder of InP/ZnSe/ZnS quantum dots including oleic acid ligands on a surface thereof.

Figure 4:
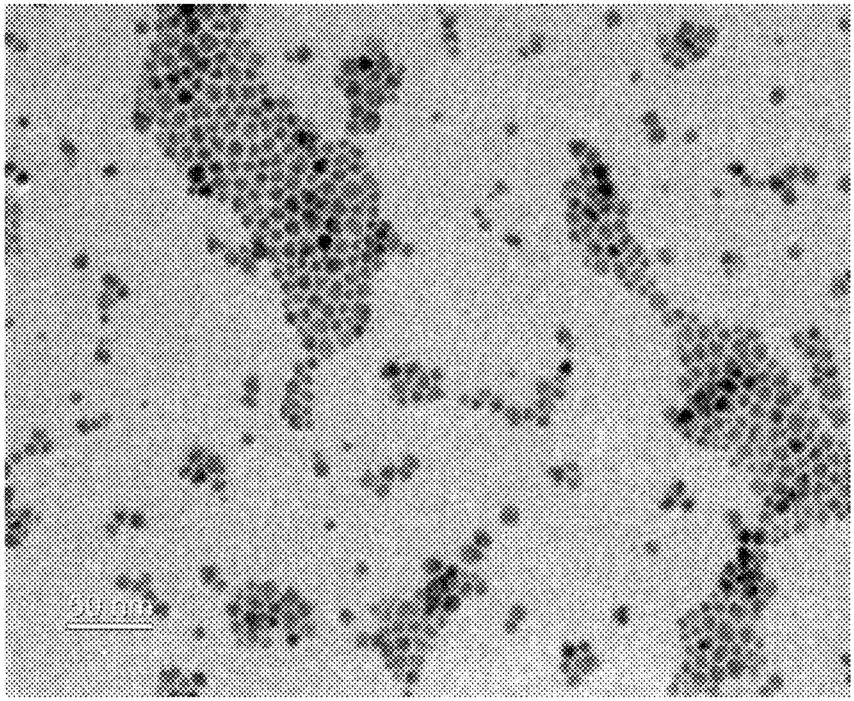
FIG. 4 is a view showing an SEM photograph of quantum dots obtained in Preparation Example 1.

100 grams (g) of the quantum dot powder was dissolved in a solution containing 125 g of toluene and 125 g of hexane, and 30 g of methoxy tetra(ethylene glycol) propionic acid as a ligand including a polar moiety, was added to the solution. Then, under a nitrogen atmosphere, the reaction temperature was raised to 80° C., and a reaction was allowed to proceed for 15 hours while maintaining the temperature so as to obtain quantum dots including ligands on a surface thereof. Hexane was added to the resultant quantum dots including the ligands on the surface thereof, and a centrifugation process resulted in the formation of a precipitate. The precipitate was purified and dispersed again in acetone. An excess of hexane was added to again facilitate precipitation of quantum dots, and the precipitate was then purified and dried. FIG. 4 shows an electron micrograph of the quantum dots thus obtained including ligands on the surface thereof.

Preparation Example 2: Preparation of Scatterer Dispersion 50 parts by weight of titanium dioxide pigment particles having an average particle diameter (D50) of 170 nm as scatterer particles, 45 parts by weight of OXT-221 (by TOAGOSEI) as a second monomer, and 5 parts by weight of, EFKA (by BASF) as a dispersant, were added to a beads mill machine and stirred for 4 hours, so as to prepare a scatterer dispersion.

Preparation Example 3: Preparation of Ink Composition of Examples 1 to 4 and Comparative Examples 1 to 5

The quantum dots including on the surface thereof the ligands prepared according to Preparation Example 1, a first monomer, a second monomer, a third monomer, a polymerization initiator, a vinyl group-containing compound, the scatterer dispersion prepared according to Preparation Example 2, and were added at ratios shown in Tables 1 and 2 and mixed using a mixer, so as to prepare ink. Each of the Preparation Examples 1 to 4 and Comparative Examples 1 to 5 also include an anti-oxidant (I1) in 0.5 parts by weight, a surfactant (F1) at 2 parts by weight, an adhesion promoter G1 in 1 part by weight, and a sensitizer (H1) in 0.5 parts by weight. In Tables 1 and 2, numbers in parentheses represent the unit, parts by weight.

TABLE 1

| | Quantum dot (parts by weight) | First monomer (parts by weight) | Second monomer (parts by weight) | Third monomer (parts by weight) | Polymerization initiator (parts by weight) | Vinyl compound (parts by weight) | Scatterer dispersion (parts by weight) |
|---|---|---|---|---|---|---|---|
| Ex. 1 | A1 (35) | B2 (19) | B3 (19) | B1 (10) | C1 (3) | D1 (10) | — |
| Ex. 2 | A1 (35) | B2 (15) | B3 (15) | B1 (10) | C1 (3) | D1 (10) | E1 (8) |
| Ex. 3 | A1 (35) | B2 (19) | B3 (19) | B1 (10) | C1 (3) | D2 (10) | — |
| Ex. 4 | A1 (35) | B2 (31) | B3 (15) | B1 (10) | C1 (3) | D2 (10) | E1 (8) |
| Comp. Ex. 1 | AX (35) | B2 (19) | B3 (19) | B1 (10) | C1 (3) | D1 (10) | — |
| Comp. Ex. 2 | A1 (35) | B2 (24) | B3 (24) | B1 (10) | C1 (3) | — | — |
| Comp. Ex. 3 | A1 (35) | B2 (24) | B3 (16) | B1 (10) | C1 (3) | — | E1 (8) |

TABLE 2

| | Quantum dot (parts by weight) | Binder (parts by weight) | Acryl-based first monomer (parts by weight) | Acryl-based second monomer (parts by weight) | Photopolymerization initiator (parts by weight) | Scatterer dispersion (parts by weight) |
|---|---|---|---|---|---|---|
| Comp. Ex. 4 | A1 (35) | — (0) | J1 (50) | J2 (8) | C2 (3) | — (0) |

TABLE 2-continued

| | Quantum dot (parts by weight) | Binder (parts by weight) | Acryl-based first monomer (parts by weight) | Acryl-based second monomer (parts by weight) | Photopoly-merization initiator (parts by weight) | Scatterer dispersion (parts by weight) |
|---|---|---|---|---|---|---|
| Comp. Ex. 5 | A1 (35) | J3 (20) | J1 (30) | J2 (8) | C2 (3) | — (0) |

In Tables 1 and 2, the designations are represented as follows:

- A1: quantum dots of Preparation Example 1; AX: quantum dots including on surface thereof oleic acid ligands;
- B1: Celloxide 2021P (Daicell); B2: neopentylglycol diglycidyl ether (by Kukdo Finechem Co., Ltd.); B3: OXT-221 (by TOAGOSEI);
- C: OMNICAT 270 (by IGM Resin);
- D1: DVE-3 (by BASF); D2: CHDM-di (by BASF);
- E1: titanium dioxide dispersion prepared by the method of Preparation Example 2;
- F1: MEGAFACE F-552 (by DIC);
- G1: KBM-403 (by Shin Etsu);
- H1: 9,10-dimethoxyanthracene (by Merck);
- I1: 2,6-di-t-butyl-4-methylphenol (by Merck);
- J1: hexanediol diacrylate (by Miwon Commercial Co., Ltd.); J2: dipentaerythritol hexaacrylate (by Nippon Kayaku); and
- J3: Phoret ZAH-106 (by Soken) including 65 parts by weight of propylene glycol methylether acetate solvent.

Evaluation Example

Viscosity, storage stability, light conversion rate, light absorption rate, adhesion, out-gassing, and tack-free time of the ink compositions were measured, and results are shown in Table 3. Here, the viscosity, storage stability, light conversion rate, light absorption rate, adhesion, out-gassing, and tack-free time were measured by respective methods described below:

(1) Measurement of Viscosity

The viscosity of the ink compositions of Examples 1 to 4 and Comparative Examples 1 to 5 was measured using a viscometer (Brookfield Model DV-II with Spindle RV-2) at room temperature (25° C.).

(2) Measurement of Storage Stability

Regarding the ink compositions of Examples 1 to 4 and Comparative Examples 1 to 5, the viscosity was measured using a viscometer (Brookfield Model DV-II with Spindle RV-2). The ink compositions were stored for 4 weeks at room temperature (25° C.) while being stirred with a shaker in an environment shielded from ultraviolet light. Then, a change in the viscosity thereof over time was observed. Here, the viscosity changed within 10% was denoted by O, and the viscosity changed in 10% or more was denoted by X.

(3) Measurement of Light Conversion Rate and Light Absorption Rate

Each of the ink compositions of Examples 1 to 4 and Comparative Examples 1 to 5 was applied to a glass substrate for display having a size of 50 mm (width)×50 nm (length)×0.5 mm (thickness) to a thickness of 10 μm by adjusting the number of rotations using a spin coater. Then, in the atmosphere, a film was formed by irradiating the glass substrate with ultraviolet rays having a wavelength of 395 nm and curing the ink composition. The glass substrate was cut so that the central portion of the film had a size of 20 mm (width)×20 mm (length). Afterwards, initial conversion rate of blue light was measured (step 1). Here, the conversion rate of blue light was measured with an integral hemispherical film-type measuring instrument (manufactured by Otsuka). In detail, blue light having a wavelength in a range of about 450 nm to about 460 nm was applied to the film formed using the ink composition, and all green light emitted every upward direction upward was captured and calculated as an integral value. Then, the increase in light that was converted to green was calculated relative to the decrease in light upon the absorption of blue light so as to measure the light conversion rate (green/blue). At the same time, the light absorption of blue light was also measured using the same measuring instrument. Here, the light conversion rate of 30% or more was denoted by O, the light conversion rate of less than 30% was denoted by X, the light absorption rate of 90% or more was denoted by O, and the light absorption rate of less than 90% was denoted by X.

(4) Measurement of Adhesion

Each of the ink compositions of Examples 1 to 4 and Comparative Examples 1 to 5 was applied to a glass substrate for display having a size of 50 mm (width)×50 nm (length)×0.5 mm (thickness) to a thickness of 10 μm by adjusting the number of rotations using a spin coater. Then, a film was formed by irradiating the glass substrate with ultraviolet rays having a wavelength of 395 nm. After exposure of the film thereto for 5 minutes, a cross-cur testing (as per ASTM-D3359) was performed on each sample example. In detail, on a specimen, 11 horizon lines and 11 vertical lines were drawn at intervals of 1 mm with a knife so that 100 square grids each having a size of 1 mm (width)×1 mm (length) were formed. Then, a piece of 610 scotch tape (manufactured by 3M company) was applied to the grid-formed surface. When the tape peeled off, the state of the detached grid surface was measured and evaluated according to the following criteria.

Adhesion Force Evaluation as per ASTM-D3359

- 5B: there is no detached surface
- 4B: the area of the detached surface is within 5% of the total area
- 3B: the detached surface is in a range of 5% to 15% of the total area
- 2B: the detached surface is in a range of 15% to 35% of the total area
- 1B: the detached surface is in a range of 35% to 65% of the total area
- 0B: almost all surfaces were detached Regarding the adhesion evaluation results, ASTM of 3B or greater was denoted by O, ASTM between 2B and 1B was denoted by Δ, and ASTM of 0B was denoted by X.

(5) Measurement of Out-Gassing 10 milligrams (mg) of each of the ink compositions of Examples 1 to 4 and Comparative Examples 1 to 5 was sealed in a vial, cured by UV irradiation, and heated at 180° C. for 30 minutes in a HSS-GC apparatus (manufactured by Agillent). Then, the out-gassing was quantified by gas chromatography, and the quantified value was calculated in ppm by toluene conversion. The measured quantity of 500 ppm or less was denoted by O the measured quantity of 1,000 ppm or less was denoted b Δ, and the measured quantity of greater than 1,000 ppm was denoted by X.

(6) Measurement of tack-free time

Each of the ink compositions of Examples 1 to 4 and Comparative Examples 2 and 3 was irradiated with 1 Joules per square centimeter ($J/cm^2$) of UV at the intensity of 1,000 milliwatts per square centimeter ($mW/cm^2$), and the tack-free time of the cured compositions was respectively measured. First, each of the ink compositions was spin-coated to a thickness of 10 micrometers (μm), and cured by UV irradiation as described above. When a surface of a film formed using the ink composition was touched immediately after the completion of curing process, the time until the curing proceeds sufficiently so that the stickiness disappears and there is no smearing of the ink composition was defined as tack-free time. The tack-free time for the ink compositions was respectively measured. The immediate tack-free time of less than 1 second was classified into Grade ◎, the tack-free time of less than 1 minute was classified into Grade O, the tack-free time of 5 minutes or more was classified into Grade Δ, and the tack-free time of 30 minutes or more was classified into Grade X.

When each of the ink compositions of Comparative Examples 4 and 5 was irradiated with UV in air or a nitrogen atmosphere the surface curing of the ink compositions did not proceed well, and thus, these ink compositions received Grade X. Meanwhile, when the ink composition of Comparative Example 4 was irradiated with UV in the nitrogen atmosphere, the curing was acceptable.

TABLE 3

| | Viscosity (mPa · s) | Storage stability | Light conv. rate | Light absorp. rate | Adhesion | Out-gassing | Tack-free time |
|---|---|---|---|---|---|---|---|
| Example 1 | 32.3 | ○ | ○ | ○ | ○ | ○ | ◎ |
| Example 2 | 34.2 | ○ | ○ | ○ | ○ | ○ | ◎ |
| Example 3 | 33.1 | ○ | ○ | ○ | ○ | ○ | ◎ |
| Example 4 | 36.3 | ○ | ○ | ○ | ○ | ○ | ◎ |
| Comparative Example 1 | | failed to evaluate physical properties of the ink compositions due to poor dispersion state of quantum dots | | | | | |
| Comparative Example 2 | 35.9 | ○ | ○ | ○ | ○ | ○ | ○ |
| Comparative Example 3 | 37.1 | ○ | ○ | ○ | ○ | ○ | ○ |
| Comparative Example 4 | 34.6 | ○ | ○ | ○ | X | X | X (◎*) |
| Comparative Example 5 | 43.2 | ○ | ○ | ○ | Δ | X | X (X*) |

In Table 3, * indicates a value when curing was performed in the nitrogen atmosphere.

As described above, according to the one or more embodiments, an electronic apparatus having high efficiency and/or high color purity may be provided. The scope of the present disclosure is not limited by such effects.

It should be understood that embodiments described herein should be considered in a descriptive sense only and not for purposes of limitation. Descriptions of features or aspects within each embodiment should typically be considered as available for other similar features or aspects in one or more embodiments. While one or more embodiments have been described with reference to the figures, it will be understood by those of ordinary skill in the art that various changes in form and details may be made therein without departing from the spirit and scope as defined by the following claims.

What is claimed is:

1. An ink composition comprising:

a quantum dot comprising one or more ligands on a surface of the quantum dot, wherein the one or more ligands comprise one or more polar moieties;

a first monomer;

a second monomer comprising one or more oxetane groups;

a third monomer comprising one or more epoxy groups;

wherein the first monomer is represented by Formula 1-1 or 1-2, and is different than the third monomer; and a vinyl group-containing compound comprising one or more vinyl groups, Formula 1-1

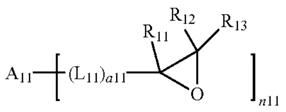

-continued

Formula 1-2

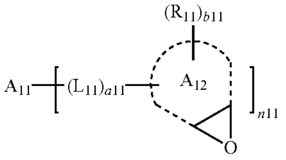

wherein $A_{11}$ is a linear or branched $C_1$-$C_{20}$ alkane group, a $C_3$-$C_{20}$ cyclic alkane group, a linear or branched $C_2$-$C_{20}$ alkene group, a $C_3$-$C_{20}$ cyclic alkene group, or a $C_6$-$C_{20}$ arene group, $A_{12}$ is a $C_3$-$C_{20}$ cyclic alkane group or a $C_3$-$C_{20}$ cyclic alkene group, $L_{11}$ is

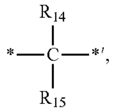

*—O—*', or

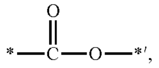

$R_{11}$ to $R_{15}$ are each independently hydrogen, deuterium, a halogen, a linear or branched $C_1$-$C_{20}$ alkyl group, or a $C_3$-$C_{20}$ cyclic alkyl group, a11 is 0, 1, 2, 3, 4, 5, 6, 7, 8, 9, or 10, b11 is an integer from 1 to 12, n11 is 1, 2, 3, 4, or 5, and

* and *' each indicate a binding site to a neighboring atom.

2. The ink composition of claim 1, wherein the second monomer is represented by Formula 2-1 or 2-2:

Formula 2-1

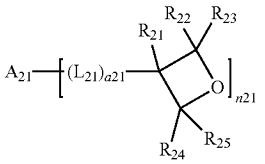

Formula 2-2

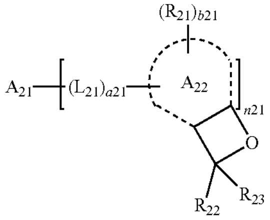

wherein, in Formulae 2-1 and 2-2, $A_{21}$ is a linear or branched $C_1$-$C_{20}$ alkane group, a cyclic $C_3$-$C_{20}$ alkane group, a linear or branched $C_2$-$C_{20}$ alkene group, a $C_3$-$C_{20}$ cyclic alkene group, or a $C_6$-$C_{20}$ arene group, $A_{22}$ is a cyclic $C_3$-$C_{20}$ alkane group or a cyclic $C_3$-$C_{20}$ alkene group, $L_{21}$ is

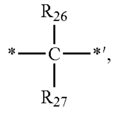

*13 O—*', or

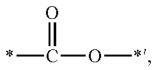

a21 is 0, 1, 2, 3, 4, 5, 6, 7, 8, 9, or 10, $R_{21}$ to $R_{27}$ are each independently hydrogen, deuterium, a halogen, or a linear or branched $C_1$-$C_{20}$ alkyl group, or a cyclic $C_3$-$C_{20}$ alkyl group, b21 is an integer from 1 to 12, n21 is 1, 2, 3, 4, or 5, and

* and *' each indicate a binding site to a neighboring atom.

3. The ink composition of claim 1, wherein A11 of the first monomer is the linear or branched $C_1$-$C_{20}$ alkane group or the linear or branched $C_2$-$C_{20}$ $_{a}$lkene group, and the third monomer includes a cyclic $C_3$-$C_{20}$ alkane group, a cyclic $C_3$-$C_{20}$ alkene group, or a $C_6$-$C_{20}$ arene group.

4. The ink composition of claim 1, wherein the first monomer is represented by Formula 1-1, and the third monomer is represented by Formula 1-2.

5. The ink composition of claim 1, wherein the vinyl group-containing compound is represented by Formula 3-1 or 3-2:

Formula 3-1

Vinyl-O-$(L_{31})_{a31}$-$R_{31}$

Formula 3-2

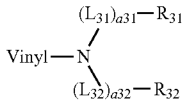

wherein, in Formulae 3-1 and 3-2,

Vinyl represents $H_2C{=}CH$—

$L_{31}$ and $L_{32}$ are each independently

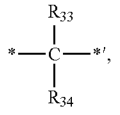

*—O—*', or

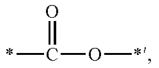

a31 and a32 are each independently 0, 1, 2, 3, 4, or 5, $R_{31}$ to $R_{34}$ are each independently hydrogen, deuterium, a halogen, a linear or branched $C_1$-$C_{20}$ alkyl group, or a cyclic $C_3$-$C_{20}$ alkyl group, wherein $R_{31}$ and $R_{32}$ are optionally linked to form a substituted or unsubstituted carbocyclic group or a substituted or unsubstituted heterocyclic group, and

* and *' each indicate a binding site to a neighboring atom.

6. The ink composition of claim 1, wherein the vinyl group-containing compound is present in the ink composition in a range of about 10 parts by weight to about 150 parts by weight of based on 100 parts by weight of the first monomer.

7. The ink composition of claim 1, wherein the ink composition has a viscosity of 80 millipascals seconds or less at 25° C.

8. The ink composition of claim 7, wherein the ink composition does not include a solvent.

9. The ink composition of claim 1, wherein the one or more polar moieties comprise an oxyalkylene group.

10. The ink composition of claim 1, wherein the one or more ligands and the quantum dot are chemically bonded via a hydroxy group, a mercapto group, a carboxyl group, an ester group, a phosphoric acid group, or a combination thereof.

11. The ink composition of claim 1, further comprising a polymerization initiator, wherein the polymerization initiator comprises sulfonium or iodonium, or the ink composition comprises a solvent in an amount of less than 2 parts by weight based on 100 parts by weight of the ink composition.

12. The ink composition of claim 1, wherein the first monomer is selected from the group consisting of butyl glycidyl ether, isobutyl glycidyl ether, 2-ethylhexyl glycidyl ether, hexadecyl glycidyl ether, triethyleneglycol diglycidyl ether, allyl glycidyl ether, polypropylene glycol glycidyl ether, glycidyl ester neodecanonate, 1,4-butanediol diglycidyl ether, ethylene glycol diglycidyl ether, 1,6-hexanediol diglycidyl ether, propylene glycol diglycidyl ether, diethylene glycol diglycidyl ether, neopentyl glycol diglycidyl ether, 1,4-cyclohexanedimethanol diglycidyl ether, and polypropylene glycol diglycidyl ether, cyclohexyldimethanol glycidyl ether, dicyclopentadiene glycidyl ether, 1,2-epoxy-4-vinylcyclohexane, 3',4'-epoxycyclohexylmethyl 3,4-epoxycyclohexyl carboxylate, 3',4'-epoxycyclohexylmethyl-3,4-epoxycyclohexyl carboxylate denatured caprolactone, naphthyl glycidyl ether, cresyl glycidyl ether, para t-butylphenol glycidyl ether, thiodiphenyl diglycidyl ether, 3-alkylphenol glycidyl ether, o-phenylphenol glycidyl ether, benzyl glycidyl ether, o-butylphenyl glycidyl ether, resorcinol diglycidyl ether, bisphenol A diglycidyl ether, bisphenol F diglycidyl ether, bisphenol S diglycidyl ether, 2,2"-diarylbisphenolA diglycidyl ether, 2-biphenyl glycidyl ether, triglycidyl aminophenol, and tetraglycidyl methylenedianiline; and the second monomer is selected from the group consisting of 1,4-bis[(3-ethyl-3- oxetanyl methoxy)methyl]benzene, 1,4-bis[(3-methyl-3-oxetanyl methoxy)methyl] benzene, 3-methyl-3-glycidyl oxetane, 3-ethyl-3-glycidyl oxetane, di[1-ethyl(3-oxetanyl)]methylether, 3-ethyl-3-hydroxymethyl oxetane, 3-ethyl-3-[(3-ethoxyoxetane-3-yl) methoxy]oxetane, 3-ethyl-3-phenoxymethyl oxetane, 3-ethyl-3-[(2-ethylhexyloxy) methyl] oxetane, oxetanyl-silicate, and phenolnovolac oxetane.

13. An ink composition comprising:

a quantum dot comprising one or more ligands on a surface of the quantum dot, wherein the one or more ligands comprise one or more polar moieties;

a first monomer comprising one or more epoxy groups;

a second monomer comprising one or more oxetane groups; and a vinyl group-containing compound comprising one or more vinyl groups, wherein the vinyl group-containing compound is present in the ink composition in a range of about 10 parts by weight to about 150 parts by weight of based on 100 parts by weight of the first monomer.

14. The ink composition of claim 13, wherein the first monomer is represented by Formula 1-1 or 1-2, and the second monomer is represented by Formula 2-1 or 2-2:

Formula 1-1

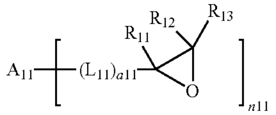

Formula 1-2

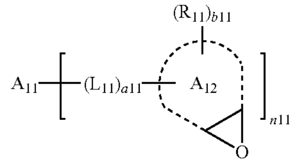

Formula 2-1

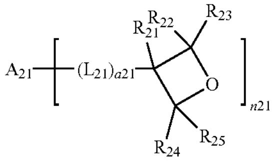

Formula 2-2

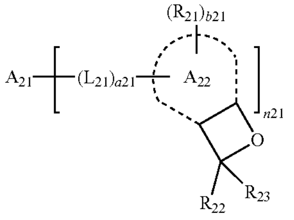

wherein, in Formulae 1-1, 1-2, 2-1, and 2-2, $A_{11}$ is a linear or branched $C_1$-$C_{20}$ alkane group, a $C_3$-$C_{20}$ cyclic alkane group, a linear or branched $C_2$-$C_{20}$ alkene group, a $C_3$-$C_{20}$ cyclic alkene group, or a $C_6$-$C_{20}$ arene group, $A_{12}$ is a $C_3$-$C_{20}$ cyclic alkane group or a $C_3$-$C_{20}$ cyclic alkene group, $L_{11}$ is

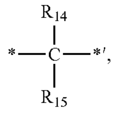

*—O—*', or

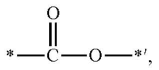

a11 is 0, 1, 2, 3, 4, 5, 6, 7, 8, 9, or 10, $R_{11}$ to $R_{15}$ are each independently hydrogen, deuterium, a halogen, a linear or branched $C_1$-$C_{20}$ alkyl group, or a $C_3$-$C_{20}$ cyclic alkyl group, b11 is an integer from 1 to 12, n11 is 1, 2, 3, 4, or 5, $A_{21}$ is a linear or branched $C_1$-$C_{20}$ alkane group, a cyclic $C_3$-$C_{20}$ alkane group, a linear or branched $C_2$-$C_{20}$ alkene group, a $C_3$-$C_{20}$ cyclic alkene group, or a $C_6$-$C_{20}$ arene group, $A_{22}$ is a cyclic $C_3$-$C_{20}$ alkane group or a cyclic $C_3$-$C_{20}$ alkene group, $L_{21}$ is

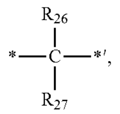

*—O—*', or

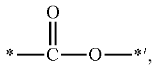

a21 is 0, 1, 2, 3, 4, 5, 6, 7, 8, 9, or 10, $R_{21}$ to $R_{27}$ are each independently hydrogen, deuterium, a halogen, or a linear or branched $C_1$-$C_{20}$ alkyl group, or a cyclic $C_3$-$C_{20}$ alkyl group, b21 is an integer from 1 to 12, n21 is 1, 2, 3, 4, or 5, and

* and *40 each indicate a binding site to a neighboring atom.

15. The ink composition of claim 13, further comprising a third monomer wherein the first monomer is represented by Formula 1-1 and the third monomer is represented by Formula 1-2:

Formula 1-1

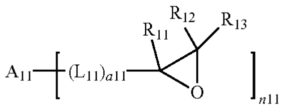

Formula 1-2

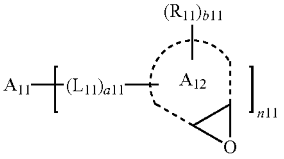

wherein, in Formulae 1-1 and 1-2, $A_{11}$ is a linear or branched $C_1$-$C_{20}$ alkane group or a linear or branched $C_2$-$C_{20}$ alkene group, $A_{12}$ is a cyclic $C_3$-$C_{20}$ alkane group or a cyclic $C_3$-$C_{20}$ alkene group, $L_{11}$ is

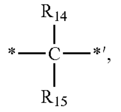

*—O—*', or

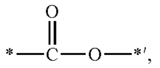

a11 is 0, 1, 2, 3, 4, 5, 6, 7, 8, 9, or 10, $R_{11}$ to $R_{15}$ are each independently hydrogen, deuterium, a halogen, a linear or branched $C_1$-$C_{20}$ alkyl group, or a cyclic $C_3C_{20}$ alkyl group, b11 is an integer from 1 to 12, n11 is 1, 2, 3, 4, or 5, and

* and *' each indicate a binding site to a neighboring atom.

16. The ink composition of claim 13, wherein the ink composition has a viscosity of 80 millipascals seconds or less at 25° C. and does not include a solvent.

* * * * *